(12) United States Patent
Hardy et al.

(10) Patent No.: US 8,092,707 B2
(45) Date of Patent: Jan. 10, 2012

(54) COMPOSITIONS AND METHODS FOR MODIFYING A SURFACE SUITED FOR SEMICONDUCTOR FABRICATION

(75) Inventors: L. Charles Hardy, St. Paul, MN (US);
Heather K. Kranz, North Oaks, MN (US); Thomas E. Wood, Stillwater, MN (US); David A. Kaisaki, Minneapolis, MN (US); John J. Gagliardi, Hudson, WI (US); John C. Clark, White Bear Lake, MN (US); Patricia M. Savu, Maplewood, MN (US); Philip G. Clark, Eden Prairie, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 1063 days.

(21) Appl. No.: 11/839,329

(22) Filed: Aug. 15, 2007

(65) Prior Publication Data

US 2008/0026583 A1    Jan. 31, 2008

Related U.S. Application Data

(63) Continuation-in-part of application No. 09/707,269, filed on Nov. 6, 2000, now abandoned, which is a continuation of application No. 09/091,932, filed as application No. PCT/US98/08693 on Apr. 30, 1998, now Pat. No. 6,194,317, which is a continuation-in-part of application No. 08/846,726, filed on Apr. 30, 1997, now abandoned.

(51) Int. Cl.
*C09K 13/00*    (2006.01)
(52) U.S. Cl. .................. 252/79.1; 252/79.2; 252/79.3; 252/79.4; 438/689; 438/690; 438/691; 438/692
(58) Field of Classification Search ........ 252/79.1–79.4; 438/689–692
See application file for complete search history.

(56) References Cited

U.S. PATENT DOCUMENTS 1,910,444 A    5/1933    Nicholson et al.
(Continued)

FOREIGN PATENT DOCUMENTS

EP    0 418 039 A2    3/1991
(Continued)

OTHER PUBLICATIONS

Young et al., "Acid Cutting and Acid Polishing of Copper Crystals", *The Review of Scientific Instruments*, vol. 32 No. 5. pp. 559-562, May 1961.

(Continued)

*Primary Examiner* — Nadine G Norton
*Assistant Examiner* — Maki Angadi
(74) *Attorney, Agent, or Firm* — James A. Baker; Ann Kulprathipanja

(57) ABSTRACT

The disclosure pertains to compositions and methods for modifying or refining the surface of a wafer suited for semiconductor fabrication. The compositions include working liquids useful in modifying a surface of a wafer suited for fabrication of a semiconductor device. In some embodiments, the working liquids are aqueous solutions of initial components substantially free of loose abrasive particles, the components including water, a surfactant, and a pH buffer exhibiting at least one $pK_a$ greater than 7. In certain embodiments, the pH buffer includes a basic pH adjusting agent and an acidic complexing agent, and the working liquid exhibits a pH from about 7 to about 12. In further embodiments, the disclosure provides a fixed abrasive article comprising a surfactant suitable for modifying the surface of a wafer, and a method of making the fixed abrasive article. Additional embodiments describe methods that may be used to modify a wafer surface.

9 Claims, 4 Drawing Sheets

U.S. PATENT DOCUMENTS

| | | | |
|---|---|---|---|
| 2,115,897 A | 5/1938 | Wooddell et al. | |
| 2,286,208 A | 6/1942 | Kirchner | |
| 2,485,295 A | 10/1949 | Larson | |
| 2,667,436 A | 1/1954 | Goepfert et al. | |
| 2,755,607 A | 7/1956 | Haywood | |
| 2,888,785 A | 6/1959 | Kellican et al. | |
| 2,952,951 A | 9/1960 | Simpson | |
| 3,041,156 A | 6/1962 | Rowse et al. | |
| 3,188,265 A | 6/1965 | Charbonneau et al. | |
| 3,324,608 A | 6/1967 | Hoenig | |
| 3,438,811 A | 4/1969 | Harriman | |
| 3,499,250 A | 3/1970 | Jensen et al. | |
| 3,504,457 A | 4/1970 | Jacobsen et al. | |
| 3,594,865 A | 7/1971 | Erb | |
| 3,605,349 A | 9/1971 | Anthon | |
| 3,849,949 A | 11/1974 | Steinhauser et al. | |
| 3,875,703 A | 4/1975 | Clemente | |
| 3,887,446 A | 6/1975 | McEwan et al. | |
| 3,911,562 A | 10/1975 | Youmans | |
| 3,916,584 A | 11/1975 | Howard et al. | |
| 4,138,228 A | 2/1979 | Hartfelt et al. | |
| 4,255,164 A | 3/1981 | Butzke et al. | |
| 4,314,827 A | 2/1982 | Leitheiser et al. | |
| 4,355,110 A | 10/1982 | Line et al. | |
| 4,479,981 A * | 10/1984 | Winters et al. | 427/485 |
| 4,509,581 A | 4/1985 | McLane et al. | |
| 4,512,113 A | 4/1985 | Budinger | |
| 4,563,388 A | 1/1986 | Bonk et al. | |
| 4,609,581 A | 9/1986 | Ott | |
| 4,623,364 A | 11/1986 | Cottringer et al. | |
| 4,642,126 A | 2/1987 | Zador et al. | |
| 4,642,221 A | 2/1987 | Hansen et al. | |
| 4,644,703 A | 2/1987 | Kaczmarek et al. | |
| 4,652,274 A | 3/1987 | Boettcher et al. | |
| 4,652,275 A | 3/1987 | Bloecher et al. | |
| 4,671,851 A | 6/1987 | Beyer et al. | |
| 4,735,632 A | 4/1988 | Oxman et al. | |
| 4,744,802 A | 5/1988 | Schwabel | |
| 4,749,617 A | 6/1988 | Canty | |
| 4,751,138 A | 6/1988 | Tumey et al. | |
| 4,770,671 A | 9/1988 | Monroe et al. | |
| 4,773,920 A | 9/1988 | Chasman et al. | |
| 4,799,939 A | 1/1989 | Bloecher et al. | |
| 4,879,258 A | 11/1989 | Fisher | |
| 4,881,951 A | 11/1989 | Wood et al. | |
| 4,885,332 A | 12/1989 | Bilkadi | |
| 4,903,440 A | 2/1990 | Larson et al. | |
| 4,906,523 A | 3/1990 | Bilkadi et al. | |
| 4,911,857 A * | 3/1990 | Machin et al. | 510/369 |
| 4,927,432 A | 5/1990 | Budinger et al. | |
| 4,930,266 A | 6/1990 | Calhoun et al. | |
| 4,933,234 A | 6/1990 | Kobe et al. | |
| 4,944,836 A | 7/1990 | Beyer et al. | |
| 4,950,696 A | 8/1990 | Palazotto et al. | |
| 4,954,142 A | 9/1990 | Carr et al. | |
| 4,959,265 A | 9/1990 | Wood et al. | |
| 4,973,421 A * | 11/1990 | Tamura et al. | 510/408 |
| 4,974,373 A | 12/1990 | Kawashima et al. | |
| 4,985,340 A | 1/1991 | Palazzotto et al. | |
| 4,997,461 A | 3/1991 | Markhoff-Matheny et al. | |
| 5,009,675 A | 4/1991 | Kunz et al. | |
| 5,011,508 A | 4/1991 | Wald et al. | |
| 5,011,513 A | 4/1991 | Zador et al. | |
| 5,014,468 A | 5/1991 | Ravipati et al. | |
| 5,015,266 A | 5/1991 | Yamamoto | |
| 5,020,283 A | 6/1991 | Tuttle | |
| 5,061,294 A | 10/1991 | Harmer et al. | |
| 5,077,870 A | 1/1992 | Melbye et al. | |
| 5,082,540 A | 1/1992 | Newman et al. | |
| 5,085,671 A | 2/1992 | Martin et al. | |
| 5,104,421 A | 4/1992 | Takizawa et al. | |
| 5,104,929 A | 4/1992 | Bilkadi | |
| 5,107,626 A | 4/1992 | Mucci | |
| 5,137,542 A | 8/1992 | Buchanan et al. | |
| 5,141,790 A | 8/1992 | Calhoun et al. | |
| 5,152,917 A | 10/1992 | Pieper et al. | |
| 5,174,795 A | 12/1992 | Wiand | |
| 5,177,908 A | 1/1993 | Tuttle | |
| 5,178,646 A | 1/1993 | Barber, Jr. et al. | |
| 5,197,999 A | 3/1993 | Thomas | |
| 5,199,227 A | 4/1993 | Ohishi | |
| 5,203,884 A | 4/1993 | Buchanan et al. | |
| 5,213,591 A | 5/1993 | Celikkaya et al. | |
| 5,219,462 A | 6/1993 | Bruxvoort et al. | |
| 5,222,329 A | 6/1993 | Yu | |
| 5,232,875 A | 8/1993 | Tuttle et al. | |
| 5,236,472 A | 8/1993 | Kirk et al. | |
| 5,254,194 A | 10/1993 | Ott et al. | |
| 5,256,170 A | 10/1993 | Harmer et al. | |
| 5,257,478 A | 11/1993 | Hyde et al. | |
| 5,279,771 A | 1/1994 | Lee | |
| 5,304,223 A | 4/1994 | Pieper et al. | |
| 5,307,593 A | 5/1994 | Lucker et al. | |
| 5,320,706 A | 6/1994 | Blackwell | |
| 5,334,332 A | 8/1994 | Lee | |
| 5,335,453 A | 8/1994 | Baldy et al. | |
| 5,340,370 A | 8/1994 | Cadien et al. | |
| 5,342,419 A | 8/1994 | Hibbard | |
| 5,366,523 A | 11/1994 | Rowenhorst et al. | |
| 5,368,618 A | 11/1994 | Masmar et al. | |
| 5,368,619 A | 11/1994 | Culler | |
| 5,370,718 A | 12/1994 | Terazawa et al. | |
| 5,378,251 A | 1/1995 | Culler et al. | |
| 5,378,252 A | 1/1995 | Follensbee | |
| 5,391,210 A | 2/1995 | Bilkadi et al. | |
| 5,391,258 A * | 2/1995 | Brancaleoni et al. | 216/89 |
| 5,417,725 A | 5/1995 | Graves | |
| 5,421,768 A | 6/1995 | Fujiwara et al. | |
| 5,422,316 A | 6/1995 | Desai et al. | |
| 5,424,224 A | 6/1995 | Allen et al. | |
| 5,435,816 A | 7/1995 | Spurgeon et al. | |
| 5,437,754 A | 8/1995 | Calhoun | |
| 5,441,598 A | 8/1995 | Yu et al. | |
| 5,445,996 A | 8/1995 | Kodera et al. | |
| 5,453,312 A | 9/1995 | Haas et al. | |
| 5,454,844 A | 10/1995 | Hibbard et al. | |
| 5,460,742 A * | 10/1995 | Cavanagh et al. | 510/398 |
| 5,466,389 A * | 11/1995 | Ilardi et al. | 510/175 |
| 5,470,368 A | 11/1995 | Culler | |
| D366,365 S | 1/1996 | Hoopman | |
| 5,489,233 A | 2/1996 | Cook et al. | |
| 5,489,235 A | 2/1996 | Gagliardi et al. | |
| 5,490,808 A | 2/1996 | Jantschek et al. | |
| 5,500,273 A | 3/1996 | Holmes et al. | |
| 5,505,747 A | 4/1996 | Chesley et al. | |
| 5,507,978 A * | 4/1996 | Honda | 510/176 |
| 5,527,368 A | 6/1996 | Supkis et al. | |
| 5,527,423 A | 6/1996 | Neville et al. | |
| 5,575,885 A | 11/1996 | Hirabayashi et al. | |
| 5,578,362 A | 11/1996 | Reinhardt et al. | |
| 5,607,341 A | 3/1997 | Leach | |
| 5,607,346 A | 3/1997 | Wilson et al. | |
| 5,607,488 A | 3/1997 | Wiand | |
| 5,609,517 A | 3/1997 | Lofaro | |
| 5,622,875 A | 4/1997 | Lawrence | |
| 5,624,303 A | 4/1997 | Robinson | |
| 5,643,044 A | 7/1997 | Lund | |
| 5,649,855 A | 7/1997 | Chikaki | |
| 5,692,950 A | 12/1997 | Rutherford et al. | |
| 5,700,383 A | 12/1997 | Feller et al. | |
| 5,709,588 A | 1/1998 | Muroyama | |
| 5,770,095 A | 6/1998 | Sasaki et al. | |
| 5,780,358 A | 7/1998 | Zhou et al. | |
| 5,823,855 A | 10/1998 | Robinson | |
| 5,827,637 A | 10/1998 | Uchida et al. | |
| 5,840,629 A | 11/1998 | Carpio | |
| 5,897,375 A | 4/1999 | Watts et al. | |
| 5,897,426 A | 4/1999 | Somekh | |
| 5,911,835 A | 6/1999 | Lee et al. | |
| 5,954,997 A * | 9/1999 | Kaufman et al. | 252/79.1 |
| 5,958,288 A | 9/1999 | Mueller et al. | |
| 5,958,794 A | 9/1999 | Bruxvoort et al. | |
| 5,971,836 A | 10/1999 | Kogure et al. | |
| 5,972,792 A | 10/1999 | Hudson | |
| 5,980,775 A | 11/1999 | Grumbine et al. | |
| 5,981,454 A | 11/1999 | Small | |
| 6,066,028 A | 5/2000 | Cheng et al. | |

| | | | |
|---|---|---|---|
| 6,069,080 A | 5/2000 | James et al. | |
| 6,096,652 A | 8/2000 | Watts et al. | |
| 6,117,775 A | 9/2000 | Kondo et al. | |
| 6,121,143 A | 9/2000 | Messner et al. | |
| 6,156,661 A | 12/2000 | Small | |
| 6,194,317 B1 * | 2/2001 | Kaisaki et al. | 438/692 |
| 6,376,381 B1 | 4/2002 | Sabde | |
| 6,546,939 B1 | 4/2003 | Small | |
| 6,592,676 B1 | 7/2003 | Mertens et al. | |
| 6,936,543 B2 | 8/2005 | Schroeder et al. | |
| 2003/0006396 A1 | 1/2003 | Wang et al. | |
| 2003/0176151 A1 | 9/2003 | Tam et al. | |
| 2005/0282390 A1 | 12/2005 | Bian et al. | |
| 2007/0077865 A1 | 4/2007 | Dysard et al. | |

FOREIGN PATENT DOCUMENTS

| | | |
|---|---|---|
| EP | 0 447 885 A2 | 9/1991 |
| EP | 0 588 055 A2 | 3/1994 |
| EP | 0 616 362 A2 | 9/1994 |
| EP | 0 447 885 B1 | 11/1994 |
| EP | 0 627 281 A2 | 12/1994 |
| EP | 0 634 465 A1 | 1/1995 |
| EP | 0 646 436 A1 | 4/1995 |
| EP | 0 650 803 A1 | 5/1995 |
| EP | 0 650 807 A1 | 5/1995 |
| EP | 0 654 323 A1 | 5/1995 |
| EP | 0 658 400 A1 | 6/1995 |
| EP | 0 685 299 A1 | 12/1995 |
| EP | 0 418 039 B1 | 4/1996 |
| EP | 0 737 549 A2 | 10/1996 |
| EP | 0 745 456 A1 | 12/1996 |
| EP | 0 747 939 A2 | 12/1996 |
| EP | 0 646 436 B1 | 5/1998 |
| EP | 0 845 512 A1 | 6/1998 |
| EP | 0 846 742 A2 | 6/1998 |
| EP | 0 634 465 B1 | 11/1998 |
| EP | 0 650 807 B1 | 1/1999 |
| EP | 0 896 042 A1 | 2/1999 |
| EP | 0 650 803 B1 | 3/1999 |
| EP | 0 913 442 A2 | 5/1999 |
| EP | 0 588 055 B1 | 6/1999 |
| EP | 0 658 400 B1 | 3/2000 |
| EP | 0 745 456 B1 | 9/2001 |
| EP | 0 747 939 B1 | 8/2002 |
| EP | 0 737 549 B1 | 12/2002 |
| EP | 0 418 039 B2 | 5/2004 |
| EP | 0 896 042 B1 | 2/2005 |
| EP | 0 654 323 B1 | 4/2005 |
| EP | 0 846 742 B1 | 9/2005 |
| EP | 0 913 442 B1 | 12/2006 |
| JP | 63-235942 | 9/1988 |
| JP | 4-159084 | 6/1992 |
| JP | 7-124861 | 5/1995 |
| JP | 8-64562 | 3/1996 |
| JP | 9-47947 | 2/1997 |
| WO | WO 93/12911 | 7/1993 |
| WO | WO 94/04599 | 3/1994 |
| WO | WO 94/20264 | 9/1994 |
| WO | WO 94/27780 | 12/1994 |
| WO | WO 95/01241 | 1/1995 |
| WO | WO 95/07797 | 3/1995 |
| WO | WO 95/11773 | 5/1995 |
| WO | WO 95/19242 | 7/1995 |
| WO | WO 95/22436 | 8/1995 |
| WO | WO 96/25270 | 8/1996 |
| WO | WO 97/11484 | 3/1997 |
| WO | WO 97/43087 | 11/1997 |
| WO | WO 98/18159 | 4/1998 |
| WO | WO 98/26025 | 6/1998 |
| WO | WO 98/49723 | 11/1998 |
| WO | 2008/022277 | 2/2008 |
| WO | 2008/079651 | 7/2008 |
| WO | 2009/058463 | 5/2009 |

OTHER PUBLICATIONS

Leidheiser, *The Corrosion of Copper, Tin and Their Alloys*, 119-123, 1971.

West et al., *Copper and Its Alloys*, 25-30, 1982.

Wefers et al., *Oxides and Hydroxides of Aluminum*, Alcoa Technical Paper No. 19, 1987.

Tonshoff et al., "Abrasive Machine of Silicon", *Annals of the CIRP*, 39, 621-635 (1990).

Kaufman et al, "Chemical-Mechanical Polishing for Fabricating Patterned W Metal Features as Chip Interconnects", J. Electrochem. Soc., 138 (11), (1991).

Hayashi et al., "A New Abrasive-Free, Chemical-Mechanical-Polishing Technique for Aluminum Metallization of ULSI Devices", International Electron Devices Meeting 1992, San Francisco, Dec. 13-16, 1992.

Tomita et al., "A Study for Ultraprecision Processing of Silicon Wafers by Fixed Lapping Stone—A newly developed lapping stone to replace the free abrasive lapping process", *J. Precision Engineering*, 61, 1428-1432 (1995).

Kenkel, "Analytical Chemistry for Technicians", 3rd edition, Lewis Publishers, Washington, DC, (2003), pp. 112-117).

* cited by examiner

COMPOSITIONS AND METHODS FOR MODIFYING A SURFACE SUITED FOR SEMICONDUCTOR FABRICATION

CROSS REFERENCE TO RELATED APPLICATIONS

This application is a continuation-in-part of U.S. application Ser. No. 09/707,269, filed Nov. 6, 2000, now abandoned; which is a continuation of U.S. application Ser. No. 09/091,932, filed Jun. 24, 1998 issued as U.S. Pat. No. 6,194,317, which is a 35 USC §371 national stage application of International Application No. PCT/US98/08693, filed Apr. 30, 1998 which is a continuation-in-part of U.S. application Ser. No. 08/846,726 filed Apr. 30, 1997, abandoned, the disclosure of which is incorporated by reference in their entirety herein.

BACKGROUND

This disclosure relates generally to a method of modifying exposed surfaces of wafers suited for semiconductor fabrication and particularly to a method of modifying exposed surfaces of structured wafers suited for semiconductor fabrication using an abrasive article.

During integrated circuit manufacture, semiconductor wafers used in semiconductor fabrication typically undergo numerous processing steps, including deposition, patterning, and etching steps. Details of these manufacturing steps for semiconductor wafers are reported by Tonshoff et al., "Abrasive Machining of Silicon", published in the *Annals of the International Institution for Production Engineering Research*, (Volume 39/2/1990), pp. 621-635. In each manufacturing step, it is often necessary or desirable to modify or refine an exposed surface of the wafer in order to prepare the wafer for subsequent fabrication or manufacturing steps.

For example, after a deposition step, the deposited material or layer on a wafer surface generally needs further processing before additional deposition or subsequent processing occurs. In another example, after an etching step, there is often a need to deposit either, or both, conducting or insulating materials in layers on the etched surface areas of a wafer. A specific example of this process is used in metal Damascene processes.

In the Damascene process, a pattern is etched into an oxide dielectric layer. After etching, optional adhesion/barrier layers are deposited over the entire surface and then a metal is deposited over or on top of the adhesion/barrier layers. The deposited metal layer is then modified, refined or finished by removing the deposited metal and regions of the adhesion/barrier layer on the surface. Typically, enough surface metal is removed so that the outer exposed surface of the wafer comprises both metal and an oxide dielectric material. A top view of the exposed wafer surface would reveal a substantially planar surface with metal corresponding to the etched pattern and dielectric material adjacent to the metal. The metal(s) and oxide dielectric material(s) located on the modified surface of the wafer inherently have different physical characteristics, such as different hardness values. An abrasive article used to modify a wafer produced by the Damascene process must be carefully designed so as to simultaneously modify the materials without scratching the surface of either material. Further, the abrasive article must be able to create a substantially planar outer exposed surface on a wafer having an exposed area of a metal and an exposed area of a dielectric material.

Such a process of modifying the deposited metal layer until the oxide dielectric material is exposed on the wafer outer surface leaves little margin for error because of the submicron dimensions of the metal features located on the wafer surface. It is clear that the removal rate of the deposited metal must be fast to minimize manufacturing costs. Further, metal removal from areas which were not etched must be complete. Still further, metal remaining in etched areas must be limited to discrete areas or zones. Yet further, the remaining metal must be continuous within an area or zone to ensure proper conductivity. In short, the metal modification process must be uniform, controlled, and reproducible on a submicron scale.

Furthermore, as a method for isolating elements of a semiconductor device, a great deal of attention has recently been directed towards a shallow trench isolation (STI) process where a silicon nitride layer is formed on a silicon substrate, shallow trenches are formed via etching or photolithography, and a dielectric layer is deposited to fill the trenches. Due to variation in the depth of trenches, or lines, formed in this manner, it is typically necessary to deposit an excess of dielectric material on top of the substrate to ensure complete filling of all trenches.

The excess dielectric material (e.g., an oxide) is then typically removed by a chemical-mechanical planarization process to expose the silicon nitride layer. In order to achieve a highly planar surface, the height of the nitride layer and the remaining trench oxide layer, should be substantially the same. Generally, past practice has been to emphasize selectivity for oxide polishing in preference to silicon nitride polishing. Thus, the silicon nitride layer has served as a stopping layer during the chemical-mechanical planarization process, as the overall polishing rate has decreased upon exposure of the silicon nitride layer.

Compositions and methods for planarizing or polishing the surface of a substrate are well known in the art. One conventional method of modifying or refining exposed surfaces of wafers employs methods that treat a wafer surface with a slurry containing a plurality of loose abrasive particles dispersed in a liquid. Typically this slurry is applied to a polishing pad and the wafer surface is then ground or moved against the pad in order to remove or take off material on the wafer surface. Generally, the slurry also contains agents which chemically react with the wafer surface. This type of process is commonly referred to as a chemical-mechanical planarization (CMP) process.

One problem with CMP slurries, however, is that the process must be carefully monitored in order to achieve a desired wafer surface topography. A second problem is the mess associated with loose abrasive slurries. Another problem is that the slurries generate a large number of particles which must be removed from the surface of the wafer and disposed of following wafer treatment. Handling and disposal of these slurries generates additional processing costs for the semiconductor wafer fabricator.

An alternative to CMP slurry methods uses an abrasive article to modify or refine a semiconductor surface. This alternative CMP process is reported in International Publication No. WO 97/11484, published Mar. 27, 1997. The reported abrasive article has a textured abrasive surface which includes abrasive particles dispersed in a binder. In use, the abrasive article is contacted with a semiconductor wafer surface, often in the presence of a fluid or liquid, with a motion adapted to modify a single layer of material on the wafer and provide a substantially planar, uniform wafer surface. Use of an abrasive article overcomes a significant number of problems associated with CMP slurries.

Embodiments of the present disclosure exploit the advantages afforded by use of abrasive articles to modify surfaces of semiconductor wafers in order to expose at least two different materials, typically having different hardness values on the surface of a wafer.

SUMMARY

This disclosure pertains to methods of modifying or refining the surface of a wafer suited for semiconductor fabrication. For example, one exemplary method may be used to modify a wafer having a first material having a surface etched to form a pattern or a design and a second material deployed over the surface of the first material. A first step of this method comprises contacting the second material of the wafer to a plurality of three-dimensional abrasive composites fixed to an abrasive article, the three-dimensional abrasive composites comprising a plurality of abrasive particles fixed and dispersed in a binder. A second step is relatively moving the wafer while the second material is in contact with the plurality of abrasive composites until the exposed surface of the wafer is substantially planar and comprises at least one area of exposed first material and one area of exposed second material. The second material is typically a metal, however the second material may be an intermediate material such as an adhesion/barrier layer, or a combination of a metal and an adhesion/barrier layer. The first material is typically a dielectric material. Suitable intermediate materials or adhesion/barrier layers include metals, oxides, nitrides, and silicides. Some particularly suitable intermediate materials or adhesion/barrier layers include tantalum, titanium, tantalum nitride, titanium nitride, and silicon nitride.

In another exemplary method of modifying the surface of a wafer, a first dielectric barrier material may be deployed over a patterned wafer surface, and a second dielectric material may deployed over the surface of the first dielectric barrier material. A first step of this method comprises contacting the second dielectric material of the wafer to a plurality of three-dimensional abrasive composites fixed to an abrasive article, the three-dimensional abrasive composites comprising a plurality of abrasive particles fixed and dispersed in a binder. A second step is relatively moving the wafer while the second dielectric material is in contact with the plurality of abrasive composites until the exposed surface of the wafer is substantially planar and comprises at least one area of exposed first dielectric barrier material and one area of exposed second dielectric material. The second dielectric material is typically silicon oxide, for example, silicon dioxide. The first dielectric barrier material is typically silicon nitride.

As used in this specification, wafer typically includes a first material with a surface etched to form a pattern or a design and a second material deployed over the surface of the first material. The designs associated with the first material include patterned areas, grooved areas, and vias, as well as other structures which make up a completed semiconductor device. The wafer surface produced by a process such as the Damascene process, and modified by the abrasive article of the present disclosure, is preferably free of scratches or other defects that would interfere with the function of the semiconductor device. In preferred embodiments, the wafer surface is substantially planar and has a surface free of scratches or other defects as measured by an Rt value. Preferred Rt values provided by certain embodiments of this disclosure are typically less than about 3,000 Angstroms, preferable less than about 1,000 Angstroms, and most preferable less than about 500 Angstroms. The wafer may include a third, fourth, fifth, or more materials forming layers on a base layer of the wafer. Each layer may be modified as exemplified above for a wafer having only a first material and a second material.

A method of modifying a wafer during the Damascene process may, for example, start with a wafer having at least a first material and a second material present on the base of the wafer. At least one of the materials may have a surface etched to form a design. An outer material is deployed over the first and second materials so as to fill the design etched into the surface. The wafer is placed in contact with a plurality of three-dimensional abrasive composites fixed to an abrasive article. The outer material of the wafer is placed in contact with a plurality of three-dimensional abrasive composites fixed to an abrasive article, the abrasive composite comprising a plurality of abrasive particles fixed and dispersed in a binder. The wafer is moved relative to the abrasive article while the outer material is in contact with the plurality of abrasive composites until the exposed surface of the wafer is substantially planar and comprises at least one area of exposed first material and one area of exposed second material.

In one embodiment of this disclosure, a method of modifying a wafer may begin with a layer comprised of conductive material deployed over at least one dielectric material. The dielectric material having a surface etched to form a design. Such a wafer may be modified by contacting and relatively moving the exposed major surface of the wafer (conductive material) with respect to the abrasive article. The abrasive article typically comprises an exposed major surface of a plurality of textured, three-dimensional abrasive composite comprising a plurality of abrasive particles fixed and dispersed in a binder. Contact and motion is maintained between the plurality of abrasive composites of the abrasive article and the conductive material until an exposed surface of the wafer is substantially planar and comprises at least one area of exposed conductive material and at least one area of exposed dielectric material, and the exposed surfaces of conductive material and the exposed surfaces of dielectric material lies in a single plane. The dielectric material may be covered by one or more intermediate materials such as an adhesion/barrier layer. Typically, the exposed dielectric material surface is essentially free of the intermediate material after removal of the conductive material. Alternatively, removal of the conductive material may expose only the surface of the intermediate material and the conductive material. Continued modification may then expose on the surface of the wafer the dielectric material and the conductive material.

The present method is particularly adapted to modify conductive surfaces, typically referred to as the second material in the present application. The conductive surfaces may be made from a variety of conductive materials having resistivity values of less than about 0.1 ohm-cm. Preferred conductive materials include metals such as tungsten, copper, aluminum, aluminum copper alloy, gold, silver, or various alloys of these metals. Preferred dielectric materials generally have dielectric constants less than about 5.

In another exemplary embodiment of this disclosure, a CMP method is provided for modifying a surface of a substrate such as a semiconductor wafer to remove a selective thickness portion thereof. In one particular exemplary embodiment, the method comprises:

a. providing a wafer comprising at least a first material having a surface etched to form a pattern, a second material deployed over at least a portion of the surface of the first material, and a third material deployed over at least a portion of the surface of the second material;

b. contacting the third material of the wafer, in the presence of an aqueous working liquid substantially free of loose abrasive particles and including water, a pH buffer exhibiting at least one $pK_a$ greater than 7, and a surfactant, the pH buffer including a basic pH adjusting agent and an acidic complexing agent, and the working liquid exhibiting a pH from about 7 to about 12, with a plurality of three-dimensional abrasive composites fixed to an abrasive article, the three-dimensional abrasive composites comprising a plurality of abrasive particles fixed and dispersed in a binder; and c. relatively moving the wafer while the third material is in contact with the plurality of abrasive composites until an exposed surface of the wafer is substantially substantially planar and comprises at least one area of exposed third material and one area of exposed second material.

In a further exemplary embodiment of a CMP STI method, the method comprises:

a) providing a wafer comprising at least a barrier material deployed over at least a portion of the wafer; and a dielectric material deployed over at least a portion of the surface of the barrier material;

b) contacting the dielectric material of the wafer, in the presence of an aqueous working liquid substantially free of loose abrasive particles and including water, a pH buffer exhibiting at least one $pK_a$ greater than 7, and a surfactant, the pH buffer including a basic pH adjusting agent and an acidic complexing agent, and the working liquid exhibiting a pH from about 7 to about 12, with a plurality of three-dimensional abrasive composites fixed to an abrasive article, the three-dimensional abrasive composites comprising a plurality of abrasive particles fixed and dispersed in a binder; and c) relatively moving the wafer while the dielectric material is in contact with the plurality of abrasive composites until an exposed surface of the wafer is substantially planar and comprises at least one area of exposed dielectric material and one area of exposed barrier material.

In one particular exemplary embodiment, the dielectric material comprises silicon oxide, and the barrier material comprises silicon nitride.

In certain exemplary methods, the movement between the wafer and abrasive article occurs under pressure in a range of about 0.1 to 25 pounds per square inch (psi), about to about kilo-Pascals (kPa), preferably under a pressure in a range of about 0.2 to 15 psi (about 1.38 to about 103.42 kPa). In another embodiment of this disclosure, the wafer and abrasive article are rotated and/or moved against each other. For example, either the abrasive article or the wafer or both the abrasive article and the wafer are rotated relative to the other as well as being moved linearly along relative centers of the wafer and abrasive article. The wafer and the abrasive article may also be moved in an elliptical or a figure eight type pattern as the speed varies along the path. The rotational motion or speed of rotation between the wafer and abrasive article may be between 1 rpm to 10,000 rpm. Preferred rotational speeds for the abrasive article are when the abrasive article rotates at a speed between 10 rpm to 1,000 rpm, and more preferably between 10 rpm to 250 rpm and more preferably between 10 rpm to 60 rpm. Preferred rotational speeds for the wafer are when the wafer rotates at a speed between 2 rpm to 1,000 rpm, more preferable between 5 rpm to 500 rpm, and still more preferred between 10 rpm to 100 rpm.

In a further embodiment of this disclosure, the conductive surface of the wafer is modified by the abrasive article in the presence of a working liquid. One useful working liquid is an aqueous solution that includes a variety of different additives. Suitable additives include pH adjusting agents (e.g. acids or bases), as well as complexing, oxidizing, or passivating agents, surfactants, wetting agents, buffers, rust inhibitors, lubricants, soaps, or combinations of these additives. Additives may also include agents which are reactive with the second material, e.g., metal or metal alloy conductors on the wafer surface such as oxidizing, reducing, passivating, or complexing agents. Examples of oxidizing agents include hydrogen peroxide, nitric acid, potassium ferricyanide, ferric nitrate, or combinations of these agents. Examples of complexing agents include ammonium hydroxide and ammonium carbonate. Further, the working liquid may be relatively free of additives or other agents. In this embodiment, the working liquid may be tap water, distilled water, or deionized water. A suitable passivating agent is benzotriazole.

In one exemplary embodiment of a working liquid useful in modifying a surface of a wafer suited for fabrication of a semiconductor device, the working liquid comprises an aqueous solution of initial components substantially free of loose abrasive particles, the components including water, a pH buffer exhibiting at least one $pK_a$ greater than 7, and a surfactant, the pH buffer comprising a basic pH adjusting agent and an acidic complexing agent, and the working liquid exhibiting a pH from about 7 to about 12. In certain featured embodiments, the working liquid comprises a fluorochemical surfactant, and the working liquid exhibits a pH from about 7 to about 11.

In another exemplary embodiment, the disclosure provides a fixed abrasive article comprising a surfactant suitable for chemical mechanical polishing of a surface of a substrate. In certain exemplary embodiments, a method of preparing a fixed abrasive article comprising a surfactant suitable for modifying a surface of a wafer in a chemical mechanical polishing process comprises:

a. providing a fixed abrasive article having a surface comprising a plurality of three-dimensional abrasive composites fixed to an abrasive article, the three-dimensional abrasive composites comprising a plurality of abrasive particles fixed and dispersed in a binder;

b. exposing the surface to a surfactant solution in a solvent;

c. drying the fixed abrasive article to remove at least a portion of the solvent, thereby forming a coating of surfactant on at least a portion of the surface.

Optionally, steps (a)-(c) may be repeated at a polishing rate until a target polishing rate is obtained, and the polishing rate thereafter remains within about 200 Å/min of the target polishing rate, when the fixed abrasive article is used to polish a plurality of wafer surfaces. In some exemplary embodiments, the solvent may be an aqueous solvent (e.g. water), a nonaqueous solvent (e.g. an alcohol or other organic solvent), or a mixture of an aqueous and a nonaqueous solvent (e.g. ethanol and water).

The preferred fixed abrasive article for some embodiments of the present method comprises a textured, three-dimensional abrasive outer surface made of a plurality of abrasive particles dispersed in a binder. It is preferred that the abrasive article further comprises a backing and more preferably this backing is a polymeric film. This backing will have a front surface and a back surface. The backing may be selected from a group of materials which have been used for abrasive articles such as paper, nonwovens, cloth, treated cloth, polymeric film, and primed polymeric film. In a preferred embodiment, the backing is a primed polyester film.

At least one surface of the backing is coated with a binder and abrasive particles. It is preferred that the abrasive coating is somewhat erodible. Suitable binders may be organic or inorganic materials. It is preferred that the binder is an organic binder. Further, the binder may be a thermoplastic binder or thermosetting binder. If the binder is a thermosetting binder, the binder may preferably be formed from a binder precursor. Specifically, suitable binder precursors are in an uncured, flowable state. When the abrasive article is made, the binder precursor is exposed to conditions (typically an energy source) to help initiate cure or polymerization of the binder precursor. During this polymerization or curing step, the binder precursor is solidified and converted into a binder. In certain embodiments of this disclosure, it is preferred that the binder precursor comprises a free radical curable polymer. Upon exposure to an energy source, such as radiation energy, the free radical curable polymer is crosslinked to form the binder. Examples of some preferred free radical curable polymers include acrylate monomers, acrylate oligomers or acrylate monomer and oligomer combinations. Preferred binder precursors include acrylate functional urethane polymers.

The abrasive particles can be any suitable abrasive particles that provide the desired properties on the exposed wafer surface and specific abrasive particles may be used for specific types of materials. Desired properties may include metal cut rate, surface finish, and planarity of the exposed wafer surface. The abrasive particles may be selected depending upon the specific material of the wafer surface. For example for copper wafer surfaces, the preferred abrasive particles include alpha alumina particles. Alternatively for aluminum wafer surfaces, the preferred abrasive particles include alpha and chi alumina.

The size of the abrasive particles depends in part upon the particular composition of the abrasive article and selection of the working liquid used during the process. In general, suitable abrasive particles having an average particle size no greater than about 5 micrometers are preferred. Even more preferred are abrasive articles in which the average abrasive particle size is no greater than one micrometer and, particularly, no greater than about 0.5 micrometer.

The abrasive particles may be used in combination with filler particles. Examples of preferred filler particles include magnesium silicate, aluminum trihydrate, and combinations thereof.

In certain embodiments of the disclosure, the binder and abrasive particles provide a plurality of shaped abrasive composites. Abrasive composite features may comprise a variety of three-dimensional shapes including those bounded by a first closed plane curve extended into the third dimension with positive, zero, or negative taper to a second closed plane curve substantially parallel to the first plane curve and to the backing, or to a point. The first and second plane curves, and any intermediate, transitional curves, need not be everywhere convex. The second closed plane figure may be either larger or smaller than the first closed plane figure, may be noncongruent with the first plane figure, or may be rotated with respect to the first closed plane curve. The axis of extension, defined by the trajectory of the centroid of the closed plane curve need not be perpendicular to the first plane. The second closed plane curve may less preferably be tilted with respect to the first closed plane curve. Smaller scale features, such as grooves, may be formed on the distal surface of the abrasive composite feature.

A suitable composite feature might have, for example, a circular cross section at the base which is transformed smoothly, or in one or more discrete steps, to a six-pointed, non-equant star of slightly smaller equivalent diameter at the distal plane. These abrasive composites may be both either precisely shaped or irregularly shaped. The abrasive composites are preferably spaced apart from each other. Preferred abrasive composites have a geometric shape such as frustums of spheres, pyramids, truncated pyramids, cones, cubes, blocks, rods, cross or post-like with flat topped surfaces. The abrasive composites typically are arranged in a specific order or pattern on a surface of the backing. Alternatively, the abrasive composites may also be randomly arranged on a surface of the backing. The abrasive article may also consist of long, continuous rows of the abrasive composites. A range of areal densities of the abrasive composites may be used in the abrasive article. Suitable areal density ranges are at least 2 abrasive composites per square centimeter to at least 1,000 abrasive composites per square centimeter. In addition, the size of the abrasive composites may include heights of less than 2 millimeters, less than 0.5 millimeter, or less than 0.1 millimeter.

Still further, the abrasive composites may also include one or more additives. Suitable additives include abrasive particle surface modification additives, coupling agents, fillers, expanding agents, fibers, antistatic agents, initiators, suspending agents, lubricants, wetting agents, surfactants, pigments, dyes, UV stabilizers, complexing agents, chain transfer agents, accelerators, catalysts, activators, passivating agents, or combinations of these additives.

Additionally, the abrasive coating may be secured to a subpad. The subpad will have a front surface and a back surface and the abrasive coating will be present over the front surface of the support pad. A pressure sensitive adhesive may be applied on the back surface of the backing of the abrasive article in order to fix the abrasive article to the subpad.

The above summary is not intended to describe each illustrated embodiment or every implementation of the present disclosure. The Drawings and the Detailed Description that follow more particularly exemplify certain preferred embodiments using the principles disclosed herein.

DETAILED DESCRIPTION

Figure 1:
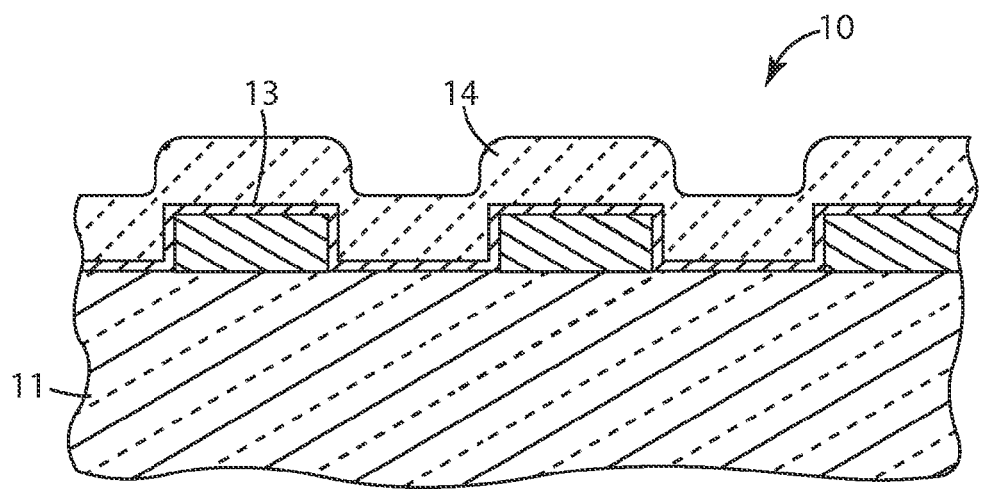
FIG. 1 is a schematic cross sectional view of a portion of a structured wafer before surface modification.

Throughout this application, the following definitions apply:

A "fixed" abrasive article is an integral abrasive article that is substantially free of unattached abrasive particles except as may be generated during the planarization process.

A "three-dimensional" abrasive article is an abrasive article having numerous abrasive particles extending throughout at least a portion of its thickness such that removing some of the particles during planarization exposes additional abrasive particles capable of performing the planarization function.

A "textured" abrasive article is an abrasive article having raised portions and recessed portions in which at least the raised portions contain abrasive particles and binder.

An "erodible" abrasive article is an abrasive article that breaks down under use conditions in a controlled manner.

An "abrasive agglomerate" refers to a plurality of abrasive particles bonded together in the form of a unitary particulate mass.

An "abrasive composite" refers to one of a plurality of shaped bodies which collectively provide a textured, three-dimensional abrasive article comprising abrasive particles and a binder. The abrasive particles may be in the form of abrasive agglomerates.

A "precisely shaped abrasive composite" refers to an abrasive composite having a molded shape that is the inverse of the mold cavity which is retained after the composite has been removed from the mold. Preferably, the composite is substantially free of abrasive particles protruding beyond the exposed surface of the shape before the abrasive article has been used, as described in U.S. Pat. No. 5,152,917 (Pieper et al.).

In conventional semiconductor device fabrication schemes, a flat, base silicon wafer is subjected to a series of processing steps which deposit uniform layers comprising regions of two or more discrete materials which together form a single layer of what will become a multilayer structure. Although the individual elements within a given layer may be formed in a variety of ways, it is common to apply a uniform layer of a first material to the wafer itself or to an existing layer of an intermediate construct by any of the means commonly employed in the art, to etch pits into or through that layer, and then to fill the pits with a second material. Alternatively, features of approximately uniform thickness comprising a first material may be deposited onto the wafer, or onto a previously fabricated layer of the wafer, usually through a mask, and then the regions adjacent to those features may be filled with a second material to complete the layer. When completed, the outer surface is substantially globally planar and parallel to the base silicon wafer surface.

Known filling operations are usually accomplished by depositing a coating of the second material onto the exposed surface of the intermediate wafer, which coating is of sufficient thickness to fill those portions of the layer under construction which have been left unoccupied by the previous deposition/etching or masked deposition step or steps. As a result, the regions of the layer which will comprise the first material in the finished semiconductor device will also be covered by the second material and the total thickness of the first material plus the overlying second material will be greater than the desired thickness of the finished exposed layer in the wafer. In the creation of a multilayer metalization architecture using a Damascene process on the exposed surface of the wafer being processed, grooves or pits are patterned on a dielectric first material, e.g., silicon dioxide. The outer most surfaces of the remaining dielectric first material and any overlying adhesion/barrier layers define a globally substantially planar first surface which locally bridges the grooves or pits without departing from planarity. A second globally substantially planar surface is defined by the aggregate bottoms of the grooves or pits similarly bridged locally for the purpose of the definition so as to pass through the patterned dielectric without interruption. Both the first and second substantially globally planar surfaces are preferably parallel to the original silicon wafer surfaces and to the surface of any layers of the device which may lie immediately below the layer being fabricated. The second substantially globally planar surface will often correspond to the surface of an immediately underlying layer if it is present. Optional adhesion/barrier layers, e.g., titanium nitride or titanium, and subsequent metal second material, e.g., copper or aluminum, layers are conformally deposited into any etched or pattern areas of the wafer. The exposed outer surface of the intermediate wafer will often then lie completely above the first substantially globally planar surface as defined herein.

Previously, the excess second material commonly has been removed by global chemical mechanical planarization (CMP) utilizing an abrasive slurry and a polishing pad. Certain embodiments of the current disclosure replace the messy slurry CMP with a relatively clean planarization process which employs a three-dimensional shaped abrasive article wherein the structured elements of the abrasive article comprise a plurality of abrasive grains within a binder. A working fluid comprising ingredients which chemically modify the second material or which otherwise facilitate the removal of the second material from the surface of the intermediate wafer under the action of the abrasive article may be used in conjunction with the abrasive article.

The following non-limiting, description exemplifies the various methods of certain embodiments of this disclosure. Delineation of the metal lines, pads, and vias formed by the Damascene process is finally obtained by a global planarization process which employs a three-dimensional abrasive article. The planarization process is accomplished by contacting the exposed faces of the wafer to be planarized to a plurality of abrasive composites on the surface of an abrasive article of the present disclosure, and relatively moving the wafer and the abrasive article while maintaining contact. A working fluid may be used that comprises ingredients that chemically modify the second material or which otherwise facilitate the removal of the second material from the surface of a first wafer material under the action of the abrasive article. The planarization process is continued until the exposed outer surface of the wafer comprises at least one area of exposed second material and one area of exposed first material defined herein. Failure to continue the planarization process sufficiently may lead to undesirable bridging of the dielectric by the conductive material. Continuing the planarization process too far beyond the first substantially globally planar surface will incur a risk of cutting one or more of the conductive lines. In specific cases, removal rate of the second material becomes slower or stops when the surface of the first material is exposed and the removal rate of the first material is different than the removal rate of the second material. The abrasive articles of the present disclosure are designed to produce a substantially planar surface on wafers comprising more than one material with each material having different removal rates. The abrasive articles of the present disclosure are designed to minimally scratch the surface of these materials during planarization.

The roles of the dielectric and the metal may be reversed; the first and second materials need not be limited to dielectrics and conductors, respectively, or even to at least one of dielectrics and conductors. One embodiment of the method of the present disclosure may begin with a wafer having more than two materials within a single layer of the finished semiconductor device; a material immediately underlying a particular region of either the first material or the second material, the material may be the first material, the second material, a third material, or a combination of materials; a second substantially globally planar surface defined with respect to the outermost aggregate set of bottoms of the grooves or pits if two or more such sets exist at differing depths within a single layer; a surface in which the second material is not present at every point above the eventual planarized surface of the final fabricated layer prior to the initiation of the planarization process of the method; and a base having a material other than silicon. FIG. 1 is a representative view of a patterned wafer 10 suitable for use in the process according certain embodiments of the disclosure. For clarity, known features such as doped regions, active devices, epitaxial layers, carrier and field oxide layers have been omitted. Wafer 10 has a base 11 and a plurality of topographical features, typically made from any appropriate material such as single crystal silicon, gallium arsenide, and other materials known in the art. A barrier or adhesion layer 13, typically titanium nitride or titanium, covers the base layer and base features. Other barrier layers may include tantalum, tantalum nitride, or silicon nitride.

Figure 2:
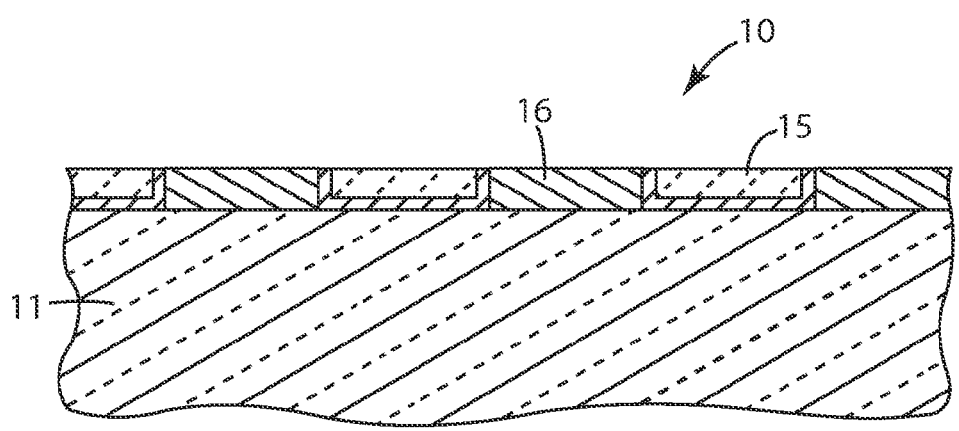
FIG. 2 is a schematic cross sectional view of a portion of a structured wafer after surface modification.

A metal conductor layer 14 covers the front surface of barrier layer 13 and base features. A variety of metal or metal alloys may be used such as aluminum, copper, aluminum copper alloy, tungsten, silver, or gold. The metal layer is typically applied by depositing a continuous layer of the metal on barrier layer 13. Excess metal is then removed to form the desired pattern of metal interconnects 15 illustrated in FIG. 2. Metal removal provides discrete metal interconnect surfaces 15 and discrete feature surfaces 16 which preferably provides a planar surface free of scratches or other defects which would otherwise interfere with the operability of the finished semiconductor device.

In an additional exemplary embodiment, a method is provided for modifying a surface of a substrate such as a semiconductor wafer, which surface includes the surface of an upper layer of a dielectric material such as a dielectric oxide, e.g., silicon dioxide ($SiO_2$) overlying a lower layer of a barrier material, e.g. silicon nitride ($Si_3N_4$), to remove substantially completely the upper layer and expose substantially completely the lower layer of silicon nitride as a substantially intact layer essentially without removing any portion of the lower layer of silicon nitride.

In one exemplary embodiment, the method comprises:

a. providing a wafer comprising at least a first material having a surface etched to form a pattern, a second material deployed over at least a portion of the surface of the first material, and a third material deployed over at least a portion of the surface of the second material;

b. contacting the third material of the wafer, in the presence of an aqueous working liquid substantially free of loose abrasive particles and including water, a pH buffer exhibiting at least one $pK_a$ greater than 7, and a surfactant, the pH buffer including a basic pH adjusting agent and an acidic complexing agent, and the working liquid exhibiting a pH from about 7 to about 12, with a plurality of three-dimensional abrasive composites fixed to an abrasive article, the three-dimensional abrasive composites comprising a plurality of abrasive particles fixed and dispersed in a binder; and c. relatively moving the wafer while the third material is in contact with the plurality of abrasive composites until an exposed surface of the wafer is substantially planar and comprises at least one area of exposed third material and one area of exposed second material.

In another particular exemplary embodiment, the method comprises a CMP STI method including:

a) providing a wafer comprising at least a conductive material having a surface etched to form a pattern, a barrier material deployed over at least a portion of the surface of the conductive material, and a dielectric material deployed over at least a portion of the surface of the barrier material;

b) contacting the dielectric material of the wafer, in the presence of an aqueous working liquid substantially free of loose abrasive particles and including water, a pH buffer exhibiting at least one $pK_a$ greater than 7, and a surfactant, the pH buffer including a basic pH adjusting agent and an acidic complexing agent, and the working liquid exhibiting a pH from about 7 to about 12, with a plurality of three-dimensional abrasive composites fixed to an abrasive article, the three-dimensional abrasive composites comprising a plurality of abrasive particles fixed and dispersed in a binder; and c) relatively moving the wafer while the dielectric material is in contact with the plurality of abrasive composites until an exposed surface of the wafer is substantially planar and comprises at least one area of exposed dielectric material and one area of exposed barrier material.

In one particular exemplary embodiment, the dielectric material comprises silicon oxide, and the barrier material comprises silicon nitride.

Apparatus

Figure 3:
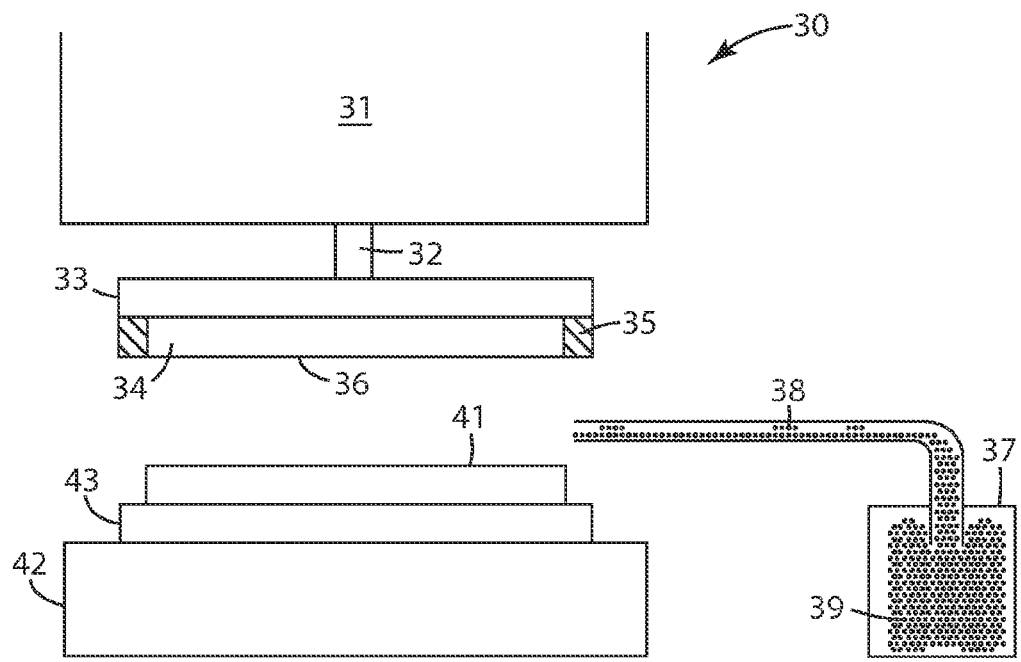
FIG. 3 is a partial side schematic view of one apparatus for modifying the surface of a wafer used in semiconductor fabrication.

FIG. 3 schematically illustrates an apparatus for modifying wafers useful in the process according to the disclosure. Numerous variations of this machine and/or numerous other machines may be useful with certain embodiments of this disclosure. This type of apparatus and numerous variations and other types of apparatus are known in the art for use with polishing pads and loose abrasive slurries. An example of a suitable, commercially available apparatus is a CMP (chemical mechanical process) machine available from IPEC/WESTECH of Phoenix, Ariz. Alternative CMP machines are available from STRASBAUGH or SPEEDFAM.

Apparatus 30 comprises head unit 31 connected to a motor (not shown). Chuck 32 extends from head unit 31; an example of such a chuck is a gimbal chuck. The design of chuck 32 preferably accommodates different forces and pivots so that the abrasive article provides the desired surface finish and flatness on the wafer. However, the chuck may or may not allow the wafer to pivot during planarization.

At the end of chuck 31 is wafer holder 33. Wafer holder 33 secures wafer 34 to head unit 31 and also prevents the wafer from becoming dislodged during processing. The wafer holder is designed to accommodate the wafer and may be, for example, circular, oval, rectangular, square, octagonal, hexagonal, or pentagonal.

In some instances, the wafer holder includes two parts, an optional retaining ring and a wafer support pad. The retaining ring may be a generally circular device that fits around the periphery of the semiconductor wafer. The wafer support pad may be fabricated from one or more elements, e.g., polyurethane foam.

Wafer holder 33 extends alongside of semiconductor wafer 34 at ring portion 35. The ring portion (which is optional) may be a separate piece or may be integral with holder 33. In some instances, wafer holder 33 will not extend beyond wafer 34 such that wafer holder 33 does not touch or contact abrasive article 42. In other instances, wafer holder 33 does extend beyond wafer 34 such that the wafer holder does touch or contact the abrasive composite, in which case the wafer holder may influence the characteristics of the abrasive composite. For example, wafer holder 33 may "condition" the abrasive article and remove the outermost portion of the surface of the abrasive article during processing.

The wafer holder or retaining ring may be made out of any material that will allow the abrasive article to impart the desired degree of modification to the wafer. Examples of suitable materials include polymeric materials.

The speed at which wafer holder 33 rotates will depend on the particular apparatus, processing conditions, abrasive article, and the desired wafer modification criteria. In general, however, wafer holder 33 rotates between about 2 to about 1,000 rpm, typically between about 5 to about 500 rpm, preferably between about 10 to about 300 rpm and more preferably between about 20 to about 100 rpm. If the wafer holder rotates too slowly or too fast, then the desired cut rate may not be achieved.

Wafer holder 33 and/or base 42 may rotate in a circular fashion, spiral fashion, a non-uniform manner, elliptical fashion as a figure eight or a random motion fashion. The wafer holder or base may also oscillate or vibrate, such as by transmitting ultrasonic vibrations through the holder or base.

The abrasive article for use with the currently employed 100 to 500 mm diameter wafers will typically have a diameter between about 10 to 200 mm, preferably between about 20 to 150 mm, more preferably between about 25 to 100 mm. The abrasive article may rotate between about 5 to 10,000 rpm, typically between about 10 to 1,000, between about 10 to 250 rpm and preferably between 10 rpm to 60 rpm. It is preferred that both the wafer and the abrasive article rotate in the same direction. However, the wafer and the abrasive article may also rotate in opposite directions.

The interface between the wafer surface 34 and wafer holder 33 preferably should be relatively flat and uniform to ensure that the desired degree of planarization is achieved. Reservoir 37 holds working liquid 39 (described in more detail below) which is pumped through tubing 38 into the interface between wafer surface and abrasive article 41 which is attached to base 42. It is preferred that during planarization there be a consistent flow of the working liquid to the interface between the abrasive article and the wafer surface. The liquid flow rate will depend in part upon the desired planarization criteria (cut rate, surface finish and planarity), the particular wafer construction and the exposed metal chemistry. The liquid flow rate typically ranges from about 10 to 1,000 milliliters/minute, preferably 10 to 500 milliliters/minute, and between about 25 to 250 milliliters/minute.

During the modifying process of the disclosure, the abrasive article is typically secured to subpad 43 which acts as a support pad for the abrasive article. In part, the subpad provides both rigidity to allow the abrasive article to effectively cut the exposed wafer surface and conformability such that the abrasive article will uniformly conform to the exposed wafer surface. This conformability is important to achieve a desired surface finish across the entire exposed wafer surface. Thus, the choice of the particular subpad (i.e., the physical properties of the subpad) should correspond to the abrasive article such that the abrasive article provides the desired wafer surface characteristics (cut rate, surface finish and planarity).

Suitable subpads may be made from any desired material such as metal or polymeric foam, rubber, and plastic sheeting and the subpad may be a composite material. A preferred two component laminate subpad having a resilient polycarbonate layer and a conformable polyurethane foam layer is reported in U.S. Pat. No. 5,692,950.

The means used to attach the abrasive article to the subpad preferably holds the abrasive article flat and rigid during planarization. The preferred attachment means is a pressure sensitive adhesive (e.g., in the form of a film or tape). Pressure sensitive adhesives suitable for this purpose include those based on latex crepe, rosin, acrylic polymers and copolymers (e.g., polybutylacrylate and other polyacrylate esters), vinyl ethers (e.g., polyvinyl n-butyl ether), alkyd adhesives, rubber adhesives (e.g., natural rubber, synthetic rubber, chlorinated rubber), and mixtures thereof. The pressure sensitive adhesive is preferably laminated or coated onto the back side of the abrasive article using conventional techniques. Another type of pressure sensitive adhesive coating is further illustrated in U.S. Pat. No. 5,141,790.

The abrasive article may also be secured to the subpad using a hook and loop type attachment system. The loop fabric may be on the back side of the abrasive article and the hooks on the subpad. Alternatively, the hooks may be on the back side of the abrasive article and the loops on the subpad. Hook and loop type attachment systems are reported in U.S. Pat. Nos. 4,609,581; 5,254,194; 5,505,747; and PCT WO 95/19242. The use of a vacuum platen has been disclosed in U.S. Pat. No. 5,593,344.

The process or method of the present disclosure may be modified to optimize wafer modification. The abrasive article may include an optical window or opening that allows an operator to look through the abrasive article and view the wafer adjacent the layer forming a plurality of abrasive composites. In addition, conventional end-point detection methods that allow monitoring of the wafer polishing process, such as detecting varying electrical characteristics of the substrate, varying mechanical torque or drag, or varying the noises generated during planarization, may be used to optimize the present method of the disclosure using abrasive articles comprising a plurality of three-dimensional abrasive composites. Methods which rely upon analysis of the effluent from the polishing operation are also expected to work well with the fixed abrasive article. The absence of a large quantity of free abrasive particles in the effluent is expected to simplify such analysis and possibly enhance the overall effectiveness of such methods. Such methods are discussed in EP 824995 A and U.S. Pat. Nos. Re. 34,425; 5,036,015; 5,069,002; 5,222,329; 5,244,534; 4,793,895; 5,242,524; 5,234,868; 5,605,760; and 5,439,551.

Methods directed toward producing uniform wear rates across the surface of the object being polished and or across the surface of the polishing pad as discussed in U.S. Pat. Nos. 5,20,283; 5,177,908; 5,234,867; 5,297,364; 5,486,129; 5,230,184; 5,245,790; and 5,562,530, may be adapted for use with the abrasive articles of the present disclosure. Conventional structures of the wafer carrier and the wafer support/attachment means which do not inherently depend on a particular abrasive surface may be used with the textured, three-dimensional abrasive composites of this disclosure. Although the abrasive surface of a textured, three-dimensional abrasive composite does not generally require routine conditioning, which is often employed with slurry/pad combinations, it may advantageously be conditioned or dressed to provide a modified, superior initial surface or to remove accumulated deposits during or between use by any suitable pad conditioning method known in the art. Variations of the wafer planarization process which employ either a continuous belt or a supply roll of sheet pad material in conjunction with a slurry may also be employed by substituting a belt or roll of textured, three-dimensional abrasive composite and an appropriate working fluid, as described in U.S. Pat. No. 5,593,344. Polishing related art such as the structure of the wafer carrier and the wafer support/attachment means which do not inherently depend on an interaction with a particular abrasive surface may be used with the abrasive article comprising textured, three-dimensional abrasive composites of this disclosure.

Operating Conditions

Variables which affect the wafer processing include the selection of the appropriate contact pressure between the wafer surface and abrasive article, type of liquid medium, relative speed and relative motion between the wafer surface and the abrasive article, and the flow rate of the liquid medium. These variables are interdependent, and are selected based upon the individual wafer surface being processed.

In general, since there can be numerous process steps for a single semiconductor wafer, the semiconductor fabrication industry expects that the process will provide a relatively high removal rate of material. The material cut rate should be at least 100 Angstroms per minute, preferably at least 500 Angstroms per minute, more preferably at least 1,000 Angstroms per minute, and most preferably at least 1500 Angstroms per minute. In some instances, it may be desirable for the cut rate to be as high as at least 2,000 Angstroms per minute, and even 3,000 or 4,000 Angstroms per minute. The cut rate of the abrasive article may vary depending upon the machine conditions and the type of wafer surface being processed.

However, although it is generally desirable to have a high cut rate, the cut rate must be selected such that it does not compromise the desired surface finish and/or topography of the wafer surface.

The surface finish of the wafer may be evaluated by known methods. One preferred method is to measure the Rt value of the wafer surface which provides a measure of "roughness" and may indicate scratches or other surface defects. See, for example, Chapter 2, RST PLUS Technical Reference Manual, Wyko Corp., Tucson, Ariz. The wafer surface is preferably modified to yield an Rt value of no greater than about 4,000 Angstroms, more preferably no greater than about 2,000 Angstroms, and even more preferably no greater than about 500 Angstroms.

Rt is typically measured using an interferometer such as a Wyko RST PLUS Interferometer, purchased from Wyko Corp., or a TENCOR profilometer. Scratch detection may also be measured by dark field microscopy. Scratch depths may be measured by atomic force microscopy. Scratch and defect free surfaces are highly desirable.

The interface pressure between the abrasive article and wafer surface (i.e., the contact pressure) is typically less than about 30 psi (about 206.84 kPa), preferably less than about 25 psi (about 172.37 kPa), more preferably less than about 15 psi (about 103.42 kPa). It has been discovered that the abrasive article used in the method according to the present disclosure provides a good cut rate at an exemplified interface pressure. Also, two or more processing conditions within a planarization process may be used. For example, a first processing segment may comprise a higher interface pressure than a second processing segment. Rotation and translational speeds of the wafer and/or the abrasive article also may be varied during the planarization process.

Working Liquids

Wafer surface processing is preferably conducted in the presence of a working liquid, which is selected based upon the composition of the wafer surface. In some applications, the working liquid typically comprises water, this water can be tap water, distilled water or deionized water. The working liquid aids processing in combination with the abrasive article through a chemical mechanical polishing process. Typically the working liquid exhibits a pH from 4 to 12. In certain applications, a narrower pH may be preferred, for example, greater than 7 to about 11. The pH of the working liquid may be advantageously adjusted for particular wafer surface materials and CMP processes. For example, for removal of surface oxide materials at high removal rates, the pH is generally no less than about 7, more preferably greater than about 8, most preferably greater than about 9. The upper limit of pH used in removal of surface oxide materials is generally no greater than about 12, preferably less than about 11, and more preferably about 10.5.

One particularly useful working liquid is an aqueous solution that includes a variety of different additives. Suitable additives include pH adjusting agents (e.g. acids or bases), as well as complexing, oxidizing, or passivating agents, surfactants, wetting agents, buffers, rust inhibitors, lubricants, soaps, or combinations of these additives. Additives may also include agents which are reactive with the second material, e.g., metal or metal alloy conductors on the wafer surface such as oxidizing, reducing, passivating, or complexing agents.

For example, during the chemical portion of polishing, the working liquid may react with the outer or exposed wafer surface. Then during the mechanical portion of processing, the abrasive article may remove this reaction product. For example, during the processing of metal surfaces, it is preferred that the working liquid is an aqueous solution which includes a chemical etchant such as an oxidizing material or agent. For example, chemical polishing of copper may occur when an oxidizing agent in the working liquid reacts with the copper to form a surface layer of copper oxides. The mechanical process occurs when the abrasive article removes this metal oxide from the wafer surface. Alternatively, the metal may first be removed mechanically and then react with ingredients in the working fluid.

Other useful chemical additives include complexing agents, which may be etchants or pH buffers, e.g. pH buffers that comprise a basic pH adjusting agents paired with an acidic complexing agent. These complexing agents may function in a manner similar to the oxidizing agents previously described in that the chemical interaction between the complexing agent and the wafer surface creates a layer which is more readily removed by the mechanical action of the abrasive composites.

When a wafer comprises copper, specific copper etchants may be used as described in Coombs, *Printed Circuits Handbook*, $4^{th}$ Ed. Chemical etchants typically contain oxidizing agents with or without acids. Suitable chemical etchants include sulfuric acid; hydrogen peroxide; cupric chloride; persulfates of ammonium, sodium and potassium; ferric chloride; chromic-sulfuric acids; potassium ferricyanide; nitric acid, and combinations thereof. Examples of suitable complexing agents include alkaline ammonia such as ammonium hydroxide with ammonium chloride and other ammonium salts and additives, ammonium carbonate, ferric nitrate, and combinations thereof. Numerous additives can be added for stability, surface treatment, or etch rate modifiers. Some additives are known to provide an isotropic etch; i.e., the same etch rate or removal rate in all directions.

Suitable oxidizing, or bleaching agents that may be incorporated into a working fluid include transition metal complexes such as ferricyanide, ammonium ferric EDTA, ammonium ferric citrate, ferric citrate, ammonium ferric oxalate, cupric citrate, cupric oxalate, cupric gluconate, cupric glycinate, cupric tartrate, and the like where the complexing agent is typically a multidentate amine, carboxylic acid, or combination of the two. Numerous coordination compounds are described in Cotton & Wilkinson, *Advanced Inorganic Chemistry*, $5^{th}$ Ed. Those with oxidizing potentials suitable for the oxidation of copper metal and/or cuprous oxide could be used, such as coordination compounds including vanadium, chromium, manganese, cobalt, molybdenum, and tungsten.

Other suitable oxidizing agents include oxo acids of the halogens and their salts, such as the alkali metal salts. These acids are described in Cotton & Wilkinson, *Advanced Inorganic Chemistry* $5^{th}$ Ed. The anions of these acids typically contain halide atoms such as: chlorine, bromine, or iodine. These halides are bonded to one, two, three, or four oxygen atoms. Examples include: chloric acid ($HOClO2$); chlorous acid ($HOClO$); hypochlorous acid ($HOCl$); and the respective sodium salts thereof. For example, sodium chlorate, sodium chlorite, and sodium hypochlorite. Similar bromine and iodine analogs are known.

For processing a wafer that contains copper, the preferred oxidizing agents include nitric acid, hydrogen peroxide, and potassium ferricyanide. Other suitable oxidizing agents are listed in West et al., *Copper and Its Alloys*, (1982), and in Leidheiser, *The Corrosion of Copper, Tin, and Their Alloys*, (1971). The concentration of the oxidizing agent in deionized water is typically from about 0.01 to 50% by weight, preferably 0.02 to 40% by weight.

The oxidation and dissolution of copper metal can be enhanced by the addition of complexing agents: ligands and/or chelating agents for copper. These compounds can bond to copper to increase the solubility of copper metal or copper oxides in water as generally described in Cotton & Wilkinson; and Hathaway in *Comprehensive Coordination Chemistry, Vol. 5*; Wilkinson, Gillard, McCleverty, Eds. Suitable additives that may be added to or used in the working liquid include monodentate complexing agents, such as ammonia, amines, halides, pseudohalides, carboxylates, thiolates, and the like also called ligands. Other additives that may be added to the working liquid include multidentate complexing agents, typically multidentate amines, and multidentate carboxylic acids. Suitable multidentate amines include ethylene-diamine, diethylene-triamine, triethylenetetramine, or combinations thereof. Suitable multidentate carboxylic acids and/or their salts include citric acid, tartaric acid, oxalic acid, gluconic acid, nitriloacetic acid, or combinations thereof. Combinations of the two monodentate and polydentate complexing agents include amino acids such as glycine, and common analytical chelating agents such as EDTA-ethylenediaminetetraacetic acid and its numerous analogs.

Additional chelators include: polyphosphates, 1,3-diketones, aminoalcohols, aromatic heterocyclic bases, phenols, aminophenols, oximes, Schiff bases, and sulfur compounds.

Similarly for processing a wafer that contains copper, the preferred complexing agents are ammonium hydroxide and ammonium carbonate. The concentration of the complexing agent in deionized water is typically from about 0.01 to 50% by weight, preferably 0.02 to 40% by weight. Complexing agents may be combined with oxidizing agents. Other suitable complexing agents are listed in West et al., *Copper and Its Alloys*, (1982), and in Leidheiser, *The Corrosion of Copper, Tin, and Their Alloys*, (1971).

Copper and its alloys are used in many environments and applications because of their excellent corrosion resistance. The nature of the copper surface in contact with a solution is related to the pH of the solution as well as the electrochemical potential of the copper. At low pH, and at high pH, copper tends to corrode. At near neutral pH and slightly basic pH, copper is passivated by copper oxide coating(s): these coatings can be cuprous oxide as well as cupric oxide. To those well acquainted to the art of abrasive surface treatment, the nature of the surface, i.e., metal or metal oxide, can have a significant effect on the action of the abrasive. Thus, the pH of the polishing solution can be important, as well as additives which can act as corrosion inhibitors and/or passivating agents.

Buffers may be added to the working liquid to control the pH and thus mitigate pH changes from minor dilution from rinse water and/or difference in the pH of the deionized water depending on the source. As mentioned above, the pH can have a significant effect on the nature of the copper surface, and the copper removal rate. The most preferred buffers are compatible with semiconductor, post-CMP cleaning needs as well as having reduced potential impurities such as alkali metals. In addition, the most preferred buffers can be adjusted to span the pH range from acidic to near-neutral to basic. Polyprotic acids act as buffers, and when fully or partially neutralized with ammonium hydroxide to make ammonium salts, they are preferred representative examples including systems of phosphoric acid-ammonium phosphate; polyphosphoric acid-ammonium polyphosphate; the boric acid-ammonium tetraborate; boric acid-ammonium pentaborate.

Other tri- and polyprotic protolytes and their salts, especially ammonium salts are preferred. These may include ammonium ion buffer systems based on the following protolytes, all of which have at least one pKa greater than 7: aspartic acid, glutamic acid, and amino acids, including, for example, alanine, proline, glycine, histidine, lysine, arginine, ornithine, cysteine, tyrosine, and dipeptides formed from two amino acids, for example, carnosine (a dipeptide formed from alanine and histidine).

Corrosion inhibitors for metals are well known, especially for steel and galvanized steel. Corrosion inhibitors for copper are often not covered in the general texts on corrosion inhibitors, but comprise a more specialized technology. The best known and most widely used inhibitors for copper are benzotriazole and its derivatives known as azole derivatives, such as tolyltriazole. Copper is known to be somewhat passivated by cuprous oxide, especially at neutral or mildly alkaline pH. In addition, phosphates are known in passivating coatings for zinc and steel. The addition of the passivating agent may protect areas of a metal surface not yet in contact with the abrasive article from premature, excessive removal by an etchant or control how much oxidizing agent reacts with the exposed metal surface. An example of a passivating agent is benzotriazole. Other passivating agents are listed in Leidheiser, *The Corrosion of Copper, Tin, and Their Alloys*, (1971), pp. 119-123. The amount and type of passivating agent will depend in part of the desired planarization criteria (cut rate, surface finish and planarity) The working liquid may also contain additives such as surfactants, wetting agents, buffers, rust inhibitors, lubricants, soaps, and the like. These additives are chosen to provide the desired benefit without damaging the underlying semiconductor wafer surface. A lubricant, for example, may be included in the working liquid for the purpose of reducing friction between the abrasive article and the semiconductor wafer surface during planarization.

Inorganic particulates may also be included in the working liquid. These inorganic particulates may aid in the cut rate. Examples of such inorganic particulates include: silica, zirconia, calcium carbonate, chromia, ceria, cerium salts (e.g., cerium nitrate), garnet, silicates and titanium dioxide. The average particle size of these inorganic particulates should be less than about 1,000 Angstroms, preferably less than about 500 Angstroms and more preferably less than about 250 Angstroms.

Although particulates may be added to the working liquid, the preferred working liquid is substantially free of inorganic particulates, e.g., loose abrasive particles which are not associated with the abrasive article. Preferably, the working liquid contains less than 1% by weight, preferably less than 0.1% by weight and more preferably 0% by weight inorganic particulates.

One suitable working liquid comprises a chelating agent, an oxidizing agent, an ionic buffer, and a passivating agent. Such a working liquid may comprise by weight percent: 3.3% hydrogen peroxide; 93.1% water; 3.0% $(NH_4)_2HPO_4$, 0.5% $(NH_4)_3$ Citrate and 0.1% 1-H-benzotriazole. Typically, the solution is used for polishing copper wafers. Another suitable working liquid comprises an oxidizing agent, an acid, and a passivating agent. Such a working solution may comprise by weight percent: 15.0% hydrogen peroxide, 0.425% phosphoric acid, 0.2% 1-H-benzotriazole, with the remaining percent being water.

In other applications, for example the removal of an oxide material (e.g. silicon dioxide) from the wafer surface, it is presently preferred that the working liquid is an aqueous solution which includes one or more of a pH adjusting agent (e.g. an acid or a base), a pH buffer (e.g. a strong acid or base and its conjugate weak base or acid), a complexing agent (e.g. a chemical agent which chelates to, or forms a chemical complex with, another chemical species, for example, a metal ion).

In some applications for the selective removal of a dielectric (e.g. an oxide material such as silicon dioxide) from a surface deployed over a barrier material (e.g. a nitride material such as silicon nitride), it is presently preferred to use an aqueous solution of a pH buffer comprising a basic pH adjusting agent paired with an acidic complexing agent, and a surfactant. The basic pH adjusting agent may be selected from alkali metal hydroxides (e.g. sodium hydroxide, potassium hydroxide, lithium hydroxide, and the like), alkaline earth metal hydroxides (e.g. calcium hydroxide, magnesium hydroxide, barium hydroxide, and the like), ammonium hydroxide, and mixtures thereof. In some exemplary embodiment, the basic pH adjusting agent is generally present in an amount sufficient to obtain a pH generally no less than about 7, more preferably greater than about 8, most preferably greater than about 9; and generally no greater than about 12, preferably less than about 11, and more preferably less than about 10.

The acidic complexing agent is preferably a multidentate acidic complexing agent, more preferably at least one of an amino acid or a dipeptide formed from an amino acid. Suitable amino acids include alanine, proline, glycine, histidine, lysine, arginine, ornithene, cysteine, tyrosine, and combinations thereof. A preferred acidic multidentate complexing agent is the amino acid praline, more preferably L-proline. The acidic complexing agent is generally present in an amount from about 0.1% w/w (i.e. percent by weight based on the working liquid), more preferably at least about 1% w/w, even more preferably at least about 2% w/w, and most preferably about 2.5% w/w; and generally no more than about 5% w/w, more preferably no more than about 4% w/w, and even more preferably less than about 3% w/w based on the weight of the working liquid.

The surfactant is generally a water soluble surfactant, with nonionic surfactants being preferred. Generally, the nonionic surfactant exhibits a calculated hydrophile-lipophile balance (i.e. HLB), calculated as the weight percent of hydrophile in the surfactant molecule divided by 5, of at least about 4, more preferably at least about 6, even more preferably at least about 8, and most preferably at least about 10. The calculated HLB is generally no greater than 20. In some embodiments, the surfactant is a fluorochemical surfactant, that is, the surfactant molecule comprises one or more fluorine atoms.

The nonionic surfactant may be advantageously selected from a linear primary alcohol ethoxylate, a secondary alcohol ethoxylate, a branched secondary alcohol ethoxylate, an octylphenol ethoxylate, an acetylenic primary alcohol ethoxylate, an acetylenic primary di-alcohol ethoxylate, an alkane di-alcohol, a hydroxyl-terminated ethylene oxide-propylene oxide random copolymer, a fluoroaliphatic polymeric ester, and mixtures thereof. Generally, the nonionic surfactant may be present in the working liquid in an amount of at least about 0.025% w/w, more preferably at least about 0.05% w/w, even more preferably about 0.1% w/w. The upper limit of surfactant concentration in the working liquid is generally at most about 1% w/w, more preferably at most about 0.5% w/w, even more preferably at most about 0.2% based on the weight of the working liquid. In certain preferred embodiments, the surfactant may be present at a concentration of at least the critical micelle concentration (CMC), and no greater than about five times the critical micelle concentration.

In one exemplary presently preferred embodiment, the working liquid comprises a basic pH adjusting agent such as ammonium hydroxide in an amount sufficient to produce a pH from about 10 to about 11, an acidic complexing agent such as L-proline in an amount from about 2% w/w to about 4% w/w based on the working liquid, and surfactant such as an ethoxylated alcohol (e.g. Tergitol™ 15-S-7, available from Dow Chemical Co., Midland, Mich.) in an amount from about 0.05% w/w to about 1% w/w based on the weight working liquid.

In certain exemplary embodiments, the surfactant is selected to be a fluorochemical surfactant. In other exemplary embodiments, the surfactant is selected to be a nonionic surfactant, and the working liquid additionally includes water, a polyelectrolyte, and a buffer comprising a basic pH adjusting agent and an acidic complexing agent. In such embodiments, the preferred pH may be generally from about 7 to about 12.

The amount of the working liquid is preferably sufficient to aid in the removal of metal or metal oxide deposits from the surface. In many instances, there is sufficient liquid from the basic working liquid and/or the chemical etchant. However, in some instances it is preferred to have a second liquid present at the planarization interface in addition to the first working liquid. This second liquid may be the same as the liquid from the first liquid, or it may be different.

Fixed Abrasive Article

The fixed abrasive article is preferably long lasting, e.g., the fixed abrasive article should be able to complete at least two, preferably at least 5, more preferably at least 20, and most preferably at least 30, different wafers. The abrasive article may contain a backing. Abrasive particles are dispersed in a binder to form textured and three-dimensional abrasive composites which are fixed, adhered, or bonded to a backing. Optionally, the fixed abrasive article does not have to have a separate backing.

In some exemplary embodiments, the fixed abrasive article comprises a surfactant coated on the surface a surface of the fixed abrasive article. In certain exemplary embodiments, the fixed abrasive article includes a plurality of three-dimensional abrasive composites fixed to an abrasive article, the three-dimensional abrasive composites comprising a plurality of abrasive particles fixed and dispersed in a binder; and a surfactant disposed on at least a portion of a surface of the three-dimensional abrasive composites.

In certain additional exemplary embodiments, a method of preparing a fixed abrasive article including a surfactant for use in modifying a surface of a wafer in a chemical mechanical polishing process includes:

a. providing a fixed abrasive article having a surface comprising a plurality of three-dimensional abrasive composites fixed to an abrasive article, the three-dimensional abrasive composites comprising a plurality of abrasive particles fixed and dispersed in a binder;

b. exposing the surface to a surfactant solution in a solvent;

c. drying the fixed abrasive article to remove at least a portion of the solvent, thereby forming a coating of surfactant on at least a portion of the surface.

In certain optional embodiments, steps (a)-(c) are repeated at a polishing rate until a target polishing rate is obtained, and the polishing rate thereafter remains within about 200 Å/min of the target polishing rate, when the fixed abrasive article is used to polish a plurality of wafer surfaces. In particular exemplary embodiments, the solvent may be an aqueous solvent (e.g. water), a nonaqueous solvent (e.g. an alcohol or other organic solvent), or a mixture of an aqueous and a nonaqueous solvent (e.g. ethanol and water).

The abrasive article should preferably provide a good cut rate. Additionally, the abrasive article is preferably capable of yielding a semiconductor wafer having an acceptable flatness, surface finish and minimal dishing. The materials, desired texture, and process used to make the abrasive article all influence whether or not these criteria are met.

In the abrasive articles used in the inventive methods described herein, the abrasive composites are "three-dimensional" such that there are numerous abrasive particles throughout at least a portion of the thickness of the abrasive article.

The abrasive article also has a "texture" associated with it, i.e., it is a "textured" abrasive article. This can be seen with reference to the abrasive articles illustrated in FIG. 4 and described above, in which the pyramid-shaped composites are the raised portions and in which the valleys between the pyramids are the recessed portions.

The recessed portions may act as channels to help distribute the working liquid over the entire wafer surface. The recessed portions may also act as channels to help remove the worn abrasive particles and other debris from the wafer and abrasive article interface. The recessed portions may also prevent the phenomenon known in the art as "stiction". If the abrasive composite is smooth rather than textured, an abrasive article tends to stick to or become lodged against the wafer surface. Finally, the recessed portions allow a higher unit pressure on the raised portions of the abrasive article and, thus help to expunge expelled abrasive particles from the abrasive surface and expose new abrasive particles.

The abrasive article of the disclosure may be circular in shape, e.g., in the form of an abrasive disc. The outer edges of the circular abrasive disc are preferably smooth or, alternatively, may be scalloped. The abrasive article may also be in the form of an oval or of any polygonal shape such as triangular, square, rectangular, and the like. Alternatively, the abrasive article may be in the form of a belt in another embodiment. The abrasive article may be provided in the form of a roll, typically referred to in the abrasive art as abrasive tape rolls. In general, the abrasive tape rolls will be indexed during the modification process. The abrasive article may be perforated to provide openings through the abrasive coating and/or the backing to permit the passage of the liquid medium before, during or after use.

Backing

The abrasive article may include a backing. It is preferred that the backing be very uniform in thickness. If the backing is not sufficiently uniform in thickness, a greater variability in the wafer uniformity may result. A variety of backing materials are suitable for this purpose, including both flexible backings and backings that are more rigid. Examples of flexible abrasive backings include polymeric film, primed polymeric film, metal foil, cloth, paper, vulcanized fiber, nonwovens and treated versions thereof and combinations thereof. One preferred type of backing is a polymeric film. Examples of such films include polyester films, polyester and co-polyester films, microvoided polyester films, polyimide films, polyamide films, polyvinyl alcohol films, polypropylene film, polyethylene film, and the like. The thickness of the polymeric film backing generally ranges between about 20 to 1,000 micrometers, preferably between 50 to 500 micrometers and more preferably between 60 to 200 micrometers.

There should also be good adhesion between the polymeric film backing and the binder. In many instances, abrasive composite coated surface of polymeric film backing is primed to improve adhesion. The primer may involve surface alteration or application of a chemical-type primer. Examples of surface alterations include corona treatment, UV treatment, electron beam treatment, flame treatment and scuffing to increase the surface area. Examples of chemical-type primers include polyvinylidene chlorides and ethylene acrylic acid copolymers reported in U.S. Pat. No. 3,188,265; colloidal dispersions reported in U.S. Pat. No. 4,906,523; and aziridine-type materials reported in U.S. Pat. No. 4,749,617.

Suitable alternative backings include an embossed polymeric film (e.g., a polyester, polyurethane, polycarbonate, polyamide, polypropylene, or polyethylene film) or embossed cellulosic backing (e.g., paper or other nonwoven cellulosic material). The embossed backing may also be laminated to a non-embossed material to form the backing. The embossed pattern can be any texture. For example, the pattern can be in the form of frustums of spheres, pyramids, truncated pyramids, cones, cubes, blocks, rods, and the like. The pattern may also be hexagonal arrays, ridges, or lattices. It is also possible to have ridges made of geometric shapes such as prisms.

Another alternative backing may also be a foamed backing, e.g., a polymeric foam such as a polyurethane foam. It is within the scope of this disclosure to apply the abrasive composite directly to the front surface of the subpad. Thus, the abrasive composite is directly bonded to the subpad.

A pressure sensitive adhesive can be laminated to the non-abrasive side of the backing. The pressure sensitive adhesive can be coated directly onto the back surface of the backing. Alternatively, the pressure sensitive adhesive can be a transfer tape that is laminated to the back surface of the backing. In another aspect of the disclosure, a foam substrate can be laminated to the backing.

Abrasive Particles

The abrasive composites comprise abrasive particles and a binder. The binder fixes abrasive particles to an abrasive article so that during the wafer modification process, the abrasive particles do not readily disassociate from the abrasive article. The abrasive particles may be homogeneously dispersed in the binder or alternatively the abrasive particles may be non-homogeneously dispersed. The term "dispersed" refers to the abrasive particles being distributed throughout the binder. It is generally preferred that the abrasive particles be homogeneously dispersed so that the resulting abrasive coating provides a more consistent modification process.

For modifying or refining wafer surfaces, fine abrasive particles are preferred. The average particle size of the abrasive particles may range from about 0.001 to 50 micrometers, typically between 0.01 to 10 micrometers. It is preferred that the average particle is less than about 5 micrometers, more preferably less than about 3 micrometers. In some instances the average particle is about 0.5 micrometers or even about 0.3 micrometers. The particle size of the abrasive particle is typically measured by the longest dimension of the abrasive particle. In almost all cases there will be a range or distribution of particle sizes. In some instances it is preferred that the particle size distribution be tightly controlled such that the resulting abrasive article provides a very consistent surface finish on the wafer. The abrasive particles may also be present in the form of an abrasive agglomerate. The abrasive particles in the agglomerate may be held together by an agglomerate binder. Alternatively, the abrasive particles may bond together by inter particle attraction forces.

Examples of suitable abrasive particles include fused aluminum oxide, heat treated aluminum oxide, white fused aluminum oxide, porous aluminas, transition aluminas, zirconia, tin oxide, ceria, fused alumina zirconia, or alumina-based sol gel derived abrasive particles. The alumina abrasive particle may contain a metal oxide modifier. Examples of alumina-based sol gel derived abrasive particles can be found in U.S. Pat. Nos. 4,314,827; 4,623,364; 4,744,802; 4,770,671; and 4,881,951.

For wafer surfaces that contain aluminum, the preferred abrasive particles are alpha alumina, chi alumina, and other transition aluminas. For semiconductor wafers that contain copper, the preferred abrasive particles are alpha alumina. The alpha alumina abrasive particles can be fused aluminum oxide abrasive particles. A preferred form of fine alpha alumina particles is fine alpha alumina particles having internal porosity. Porous alumina particles are typically formed by heating a porous transition alumina particle for a brief period of time at a temperature at which it will convert to the alpha form. This alpha alumina transformation always involves a significant decrease in surface area, but if the alpha alumina particles are exposed to the conversion temperature for a brief period of time, the resulting particles will contain internal porosity. The pores or voids in these particles are much coarser than those in the transition alumina particles. Whereas in the case of transition aluminas the pore diameters are in the range of about 1 to about 30 nm, the pores in the porous alpha alumina particles are in the range of about 40 to about 200 nm. The time required for this conversion to alpha alumina will depend on the purity of the alumina, and the particle size and crystallinity of the transition alumina. In general, the transition alumina is heated in the temperature range of 1,000 to 1400° C. for tens of seconds to minutes. An explanation of this transformation process is reported by Wefers et al., *Oxides and Hydroxides of Aluminum* (1987), published by Alcoa Company of America. A commercial source of alpha alumina abrasive particles less than one micrometer is commercially available from Praxair Surface Technologies of Indianapolis, Ind. The chi alumina particles can be a porous chi alumina particle that is formed by calcining an alumina hydrate such as alumina trihydrate. A commercial source of alumina trihydrate abrasive particles is Huber Engineered Minerals, Norcross, Ga. Ceria abrasive particles may be purchased from Rhone Poulenc; Shelton, Conn.; Transelco, N.Y.; Fujimi, Japan; Molycorp, Fairfield, N.J.; American Rar Ox, Chaveton City, Mass.; and Nanophase, Burr Ridge, Ill. Sources for alumina are Alcan Chemicals, Alcan Aluminum Corporation, Cleveland, Ohio and Condea Chemie GMBH, Hamburg, Germany. The ceria abrasive particles may either be essentially free of modifiers or dopants (e.g., other metal oxides) or may contain modifiers and/or dopants (e.g., other metal oxides). In some instances, these metal oxides may react with ceria. It is also feasible to use ceria with a combination of two or more metal oxide modifiers. These metal oxides may react with the ceria to form reaction products.

The abrasive article may also contain a mixture of two or more different types of abrasive particles. The abrasive particles may be of different hardnesses. In the mixture of two or more different abrasive particles, the individual abrasive particles may have the same average particle size, or may have a different average particle size.

In some instances it is preferred to modify or treat the surface of the abrasive particles with an additive. These additives may improve the dispersibility of the abrasive particles in the binder precursor and/or improve the adhesion to the binder precursor and/or the binder. Abrasive particle treatment may also alter and improve the cutting characteristics of the treated abrasive particles. Further treatment may also substantially lower the viscosity of the binder precursor/abrasive article slurry. The lower viscosity also permits higher percentages of abrasive particles to be incorporated into an abrasive slurry formed of a binder precursor and abrasive particles. Another potential advantage of a surface treatment is to minimize the agglomeration of the abrasive particles. Examples of suitable surface modification additives include wetting agents (sometimes referred to as surfactants) and coupling agents. A coupling agent may provide an association bridge between the binder and the abrasive particles. Examples of suitable coupling agents include silanes, titanates, and zircoaluminates. Examples of commercially available coupling agents include "A174" and "A1230" from OSI Specialties, Inc., Danbury, Conn. Still another example of such a coupling agent for ceria abrasive particles is isopropyl triisosteroyl titanate. Examples of commercial wetting agents are Disperbyk 111 available from Byk Chemie, Wallingford, Conn. and FP4 available from ICI America Inc., Wilmington, Del. There are various means to incorporate these surface treatments into the abrasive article. For example, the surface treatment agent may be added directly to the abrasive slurry during the manufacture of the abrasive article. In yet another mode, the surface treatment agent may be applied to the surface of the abrasive particles prior to being incorporated into the abrasive slurry.

Filler Particles

The abrasive composite may optionally contain filler particles. The filler may alter the erodibility of the abrasive composite. In some instances with the appropriate filler and amount, the filler may decrease the erodibility of the abrasive composite. Conversely, in some instances with the appropriate filler and amount, the filler may increase the erodibility of the abrasive composite. Fillers may also be selected to reduce cost of the abrasive composite, alter the rheology of the slurry, and/or to alter the abrading characteristics of the abrasive composite. Fillers are typically selected so as not to deleteriously affect the desired modification criteria. Examples of useful fillers for certain embodiments of this disclosure include alumina trihydrates, magnesium silicate, thermoplastic particles and thermoset particles. Other miscellaneous fillers include inorganic salts, sulfur, organic sulfur compounds, graphite, boron nitride, and metallic sulfides. These examples of fillers are meant to be a representative showing of some useful fillers, and are not meant to encompass all useful fillers. In some instances, it is preferable to use a blend of two or more different particle sizes of filler. The filler may be equant or acicular. Fillers may be provided with a surface treatment as described above for abrasive particles. The fillers should not cause excessive scratching of the exposed surfaces.

Binders

The exposed wafer surface of a semiconductor is modified with an abrasive article that contains a plurality of abrasive particles dispersed in a binder. The particular chemistry of the binder is important to the performance of the abrasive article. For example, if the binder is "too hard", the resulting abrasive article may create deep and unacceptable scratches in the exposed metal surface. Conversely, if the binder is "too soft", the resulting abrasive article may not provide a sufficient metal cut rate during the modification process or may have poor article durability. Thus, the binder is selected to provide the desired characteristics of the abrasive article.

The preferred binders are free radical curable binder precursors. These binders are capable of polymerizing rapidly upon exposures to thermal energy or radiation energy. One preferred subset of free radical curable binder precursors include ethylenically unsaturated binder precursors. Examples of such ethylenically unsaturated binder precursors include aminoplast monomers or oligomers having pendant alpha, beta unsaturated carbonyl groups, ethylenically unsaturated monomers or oligomers, acrylated isocyanurate monomers, acrylated urethane oligomers, acrylated epoxy monomers or oligomers, ethylenically unsaturated monomers or diluents, acrylate dispersions, and mixtures thereof. The term acrylate includes both acrylates and methacrylates.

The binders for the abrasive articles of this disclosure are preferably formed from an organic binder precursor. The binder precursor preferably is capable of flowing sufficiently so as to be coatable, and then solidifying. Solidification may be achieved by curing (e.g., polymerizing and/or crosslinking) and/or by drying (e.g., driving off a liquid), or simply upon cooling. The binder precursor may be an organic solvent-borne, a water-borne, or a 100% solids (i.e., a substantially solvent-free) composition. Both thermoplastic and thermosetting polymers or materials, as well as combinations thereof, may be used as the binder precursor.

In many instances, the abrasive composite is formed from a slurry of a mixture of abrasive particles and a binder precursor. The abrasive composite may comprise by weight between about 1 part abrasive particles to 95 parts abrasive particles and 5 parts binder to 99 parts binder. Preferably the abrasive composite comprises about 30 to 85 parts abrasive particles and about 15 to 70 parts binder. Likewise the abrasive composite may comprise based upon volume of abrasive composite having 0.2 to 0.8 parts abrasive particles and 0.2 to 0.8 parts binder precursor. This volume ratio is based just upon the abrasive particles and binder precursor, and does not include the volume contribution of the backing or optional fillers or additives.

The binder precursor is preferably a curable organic material (i.e., a polymer or material capable of polymerizing and/or crosslinking upon exposure to heat and/or other sources of energy, such as e-beam, ultraviolet, visible, etc., or with time upon the addition of a chemical catalyst, moisture, or other agent which cause the polymer to cure or polymerize). Binder precursor examples include epoxy polymers, amino polymers or aminoplast polymers such as alkylated urea-formaldehyde polymers, melamine-formaldehyde polymers, and alkylated benzoguanamine-formaldehyde polymer, acrylate polymers including acrylates and methacrylates such as vinyl acrylates, acrylated epoxies, acrylated urethanes, acrylated polyesters, acrylated polyethers, vinyl ethers, acrylated oils, and acrylated silicones, alkyd polymers such as urethane alkyd polymers, polyester polymers, reactive urethane polymers, phenolic polymers such as resole and novolac polymers, phenolic/latex polymers, epoxy polymers such as bisphenol epoxy polymers, isocyanates, isocyanurates, polysiloxane polymers including alkylalkoxysilane polymers, or reactive vinyl polymers. The polymers may be in the form of monomers, oligomers, polymers, or combinations thereof.

The preferred aminoplast binder precursors have at least one pendant alpha, beta-unsaturated carbonyl group per molecule or oligomer. These polymer materials are further described in U.S. Pat. Nos. 4,903,440 (Larson et al.) and 5,236,472 (Kirk et al.).

Ethylenically unsaturated binder precursors include both monomeric and polymeric compounds that contain atoms of carbon, hydrogen and oxygen, and optionally, nitrogen and the halogens. Oxygen or nitrogen atoms or both are generally present in ether, ester, urethane, amide, and urea groups. The ethylenically unsaturated monomers may be monofunctional, difunctional, trifunctional, tetrafunctional or even higher functionality, and include both acrylate and methacrylate-based monomers. Suitable ethylenically unsaturated compounds are preferably esters made from the reaction of compounds containing aliphatic monohydroxy groups or aliphatic polyhydroxy groups and unsaturated carboxylic acids, such as acrylic acid, methacrylic acid, itaconic acid, crotonic acid, isocrotonic acid, or maleic acid. Representative examples of ethylenically unsaturated monomers include methyl methacrylate, ethyl methacrylate, styrene, divinylbenzene, hydroxy ethyl acrylate, hydroxy ethyl methacrylate, hydroxy propyl acrylate, hydroxy propyl methacrylate, hydroxy butyl acrylate, hydroxy butyl methacrylate, lauryl acrylate, octyl acrylate, caprolactone acrylate, caprolactone methacrylate, tetrahydrofurfuryl methacrylate, cyclohexyl acrylate, stearyl acrylate, 2-phenoxyethyl acrylate, isooctyl acrylate, isobornyl acrylate, isodecyl acrylate, polyethylene glycol monoacrylate, polypropylene glycol monoacrylate, vinyl toluene, ethylene glycol diacrylate, polyethylene glycol diacrylate, ethylene glycol dimethacrylate, hexanediol diacrylate, triethylene glycol diacrylate, 2 (2-ethoxyethoxy) ethyl acrylate, propoxylated trimethylol propane triacrylate, trimethylolpropane triacrylate, glycerol triacrylate, pentaerythyitol triacrylate, pentaerythritol trimethacrylate, pentaerythritol tetraacrylate and pentaerythritol tetramethacrylate. Other ethylenically unsaturated materials include monoallyl, polyallyl, or polymethallyl esters and amides of carboxylic acids, such as diallyl phthalate, diallyl adipate, or N,N-diallyladipamide. Still other nitrogen containing ethylenically unsaturated monomers include tris(2-acryl-oxyethyl)isocyanurate, 1,3,5-tri(2-methyacryloxyethyl)-s-triazine, acrylamide, methylacrylamide, N-methyl-acrylamide, N,N-dimethylacrylamide, N-vinyl-pyrrolidone, or N-vinyl-piperidone.

A preferred binder precursor contains a blend of two or more acrylate monomers. For example, the binder precursor may be a blend of trifunctional acrylate and a monofunctional acrylate monomers. An example of one binder precursor is a blend of propoxylated trimethylol propane triacrylate and 2 (2-ethoxyethoxy)ethyl acrylate. The weight ratios of multifunctional acrylate and monofunctional acrylate polymers may range from about 1 part to about 90 parts multifunctional acrylate to about 10 parts to about 99 parts monofunctional acrylate.

It is also feasible to formulate a binder precursor from a mixture of an acrylate and an epoxy polymer, e.g., as described in U.S. Pat. No. 4,751,138 (Tumey et al.).

Other binder precursors include isocyanurate derivatives having at least one pendant acrylate group and isocyanate derivatives having at least one pendant acrylate group are further described in U.S. Pat. No. 4,652,274 (Boettcher et al.). The preferred isocyanurate material is a triacrylate of tris (hydroxy ethyl)isocyanurate.

Still other binder precursors include diacrylate urethane esters as well as polyacrylate or poly methacrylate urethane esters of hydroxy terminated isocyanate extended polyesters or polyethers. Examples of commercially available acrylated urethanes include those under the tradename "UVITHANE 782", available from Morton Chemical; "CMD 6600", "CMD 8400", and "CMD 8805", available from UCB Radcure Specialties, Smyrna, Ga.; "PHOTOMER" resins (e.g., PHOTOMER 6010) from Henkel Corp., Hoboken, N.J.; "EBECRYL 220" (hexafunctional aromatic urethane acrylate), "EBECRYL 284" (aliphatic urethane diacrylate of 1200 diluted with 1,6-hexanediol diacrylate), "EBECRYL 4827" (aromatic urethane diacrylate), "EBECRYL 4830" (aliphatic urethane diacrylate diluted with tetraethylene glycol diacrylate), "EBECRYL 6602" (trifunctional aromatic urethane acrylate diluted with trimethylolpropane ethoxy triacrylate), "EBECRYL 840" (aliphatic urethane diacrylate), and "EBECRYL 8402" (aliphatic urethane diacrylate) from UCB Radcure Specialties; and "SARTOMER" resins (e.g., SARTOMER 9635, 9645, 9655, 963-B80, 966-A80, CN980M50, etc.) from Sartomer Co., Exton, Pa.

Yet other binder precursors include diacrylate epoxy esters as well as polyacrylate or poly methacrylate epoxy ester such as the diacrylate esters of bisphenol A epoxy polymer. Examples of commercially available acrylated epoxies include those under the tradename "CMD 3500", "CMD 3600", and "CMD 3700", available from UCB Radcure Specialties.

Other binder precursors may also be acrylated polyester polymers. Acrylated polyesters are the reaction products of acrylic acid with a dibasic acid/aliphatic diol-based polyester. Examples of commercially available acrylated polyesters include those known by the trade designations "PHOTOMER 5007" (hexafunctional acrylate), and "PHOTOMER 5018" (tetrafunctional tetracrylate) from Henkel Corp.; and "EBECRYL 80" (tetrafunctional modified polyester acrylate), "EBECRYL 450" (fatty acid modified polyester hexaacrylate) and "EBECRYL 830" (hexafunctional polyester acrylate) from UCB Radcure Specialties.

Another preferred binder precursor is a blend of ethylenically unsaturated oligomer and monomers. For example the binder precursor may comprise a blend of an acrylate functional urethane oligomer and one or more monofunctional acrylate monomers. This acrylate monomer may be a pentafunctional acrylate, tetrafunctional acrylate, trifunctional acrylate, difunctional acrylate, monofunctional acrylate polymer, or combinations thereof.

The binder precursor may also be an acrylate dispersion like that described in U.S. Pat. No. 5,378,252 (Follensbee).

In addition to thermosetting binders, thermoplastic binders may also be used. Examples of suitable thermoplastic binders include polyamides, polyethylene, polypropylene, polyesters, polyurethanes, polyetherimide, polysulfone, polystyrene, acrylonitrile-butadiene-styrene block copolymer, styrene-butadiene-styrene block copolymers, styrene-isoprene-styrene block copolymers, acetal polymers, polyvinyl chloride and combinations thereof.

Water-soluble binder precursors optionally blended with a thermosetting resin may be used. Examples of water-soluble binder precursors include polyvinyl alcohol, hide glue, or water-soluble cellulose ethers such as hydroxypropylmethyl cellulose, methyl cellulose or hydroxyethylmethyl cellulose. These binders are reported in U.S. Pat. No. 4,255,164 (Butkze et al.).

The abrasive composites may optionally include a plasticizer. In general, the addition of the plasticizer will increase the erodibility of the abrasive composite and soften the overall binder composition. In some instances, the plasticizer will act as a diluent for the binder precursor. The plasticizer is preferably compatible with the binder to minimize phase separation. Examples of suitable plasticizers include polyethylene glycol, polyvinyl chloride, dibutyl phthalate, alkyl benzyl phthalate, polyvinyl acetate, polyvinyl alcohol, cellulose esters, silicone oils, adipate and sebacate esters, polyols, polyols derivatives, t-butylphenyl diphenyl phosphate, tricresyl phosphate, castor oil, or combinations thereof. Phthalate derivatives are one type of preferred plasticizers.

In the case of binder precursors containing ethylenically unsaturated monomers and oligomers, polymerization initiators may be used. Examples include organic peroxides, azo compounds, quinones, nitroso compounds, acyl halides, hydrazones, mercapto compounds, pyrylium compounds, imidazoles, chlorotriazines, benzoin, benzoin alkyl ethers, diketones, phenones, or mixtures thereof. Examples of suitable commercially available, ultraviolet-activated photoinitiators have tradenames such as "IRGACURE 651" and "IRGACURE 184", commercially available from the Ciba Geigy Company and "DAROCUR 1173", commercially available from Merck. Another visible light-activated photoinitiator has the trade name "IRGACURE 369", commercially available from Ciba Geigy Company. Examples of suitable visible light-activated initiators are reported in U.S. Pat. No. 4,735,632.

A suitable initiator system may include a photosensitizer. Representative photosensitizer may have carbonyl groups or tertiary amino groups or mixtures thereof. Preferred photosensitizers having carbonyl groups are benzophenone, acetophenone, benzil, benzaldehyde, o-chlorobenzaldehyde, xanthone, thioxanthone, 9,10-anthraquinone, or other aromatic ketones. Preferred photosensitizers having tertiary amines are methyldiethanolamine, ethyldiethanolamine, triethanolamine, phenylmethyl-ethanolamine, or dimethylaminoethylbenzoate. Commercially available photosensitizers include "QUANTICURE ITX", "QUANTICURE QTX", "QUANTICURE PTX", "QUANTICURE EPD" from Biddle Sawyer Corp.

In general, the amount of photosensitizer or photoinitiator system may vary from about 0.01 to 10% by weight, more preferably from 0.25 to 4.0% by weight of the components of the binder precursor.

Additionally, it is preferred to disperse (preferably uniformly) the initiator in the binder precursor before addition of any particulate material, such as the abrasive particles and/or filler particles.

In general, it is preferred that the binder precursor be exposed to radiation energy, preferably ultraviolet light or visible light, to cure or polymerize the binder precursor. In some instances, certain abrasive particles and/or certain additives will absorb ultraviolet and visible light, which may hinder proper cure of the binder precursor. This occurs, for example, with ceria abrasive particles. The use of phosphate containing photoinitiators, in particular acylphosphine oxide containing photoinitiators, may minimize this problem. An example of such an acylphosphate oxide is 2,4,6-trimethylbenzoyldiphenylphosphine oxide, which is commercially available from BASF Corporation under the trade designation "LR8893". Other examples of commercially available acylphosphine oxides include "DAROCUR 4263" and "DAROCUR 4265", commercially available from Merck.

Cationic initiators may be used to initiate polymerization when the binder is based upon an epoxy or vinyl ether. Examples of cationic initiators include salts of onium cations, such as arylsulfonium salts, as well as organometallic salts such as ion arene systems. Other examples are reported in U.S. Pat. Nos. 4,751,138 (Tumey et al.); 5,256,170 (Harmer et al.); 4,985,340 (Palazotto); and 4,950,696.

Dual-cure and hybrid-cure photoinitiator systems may also be used. In dual-cure photoinitiator systems, curing or polymerization occurs in two separate stages, via either the same or different reaction mechanisms. In hybrid-cure photoinitiator systems, two curing mechanisms occur at the same time upon exposure to ultraviolet/visible or e-beam radiation.

The abrasive composite may include other additives such as abrasive particle surface modification additives, passivating agents, water soluble additives, water sensitive agents, coupling agents, fillers, expanding agents, fibers, antistatic agents, reactive diluents, initiators, suspending agents, lubricants, wetting agents, surfactants, pigments, dyes, UV stabilizers, complexing agents, chain transfer agents, accelerators, catalysts, or activators. The amounts of these additives are selected to provide the properties desired.

Water and/or organic solvent may be incorporated into the abrasive composite. The amount of water and/or organic solvent is selected to achieve the desired coating viscosity of binder precursor and abrasive particles. In general, the water and/or organic solvent should be compatible with the binder precursor. The water and/or solvent may be removed following polymerization of the precursor, or it may remain with the abrasive composite.

Examples of ethylenically unsaturated diluents or monomers can be found in U.S. Pat. No. 5,236,472 (Kirk et al.). In some instances these ethylenically unsaturated diluents are useful because they tend to be compatible with water. Additional reactive diluents are disclosed in U.S. Pat. No. 5,178,646 (Barber et al).

Abrasive Composite Configuration

There are many different forms of three-dimensional, textured, abrasive articles. Examples of representative forms are schematically illustrated in FIGS. 4, 5, 6, and 7.

Preferred abrasive composites may be precisely shaped (as defined in the Summary above) or irregularly shaped, with precisely shaped composites being preferred.

The individual abrasive composite shape may have the form of any of a variety of geometric solids. Typically the base of the shape in contact with the backing has a larger surface area than the distal end of the composite. The shape of the composite may be selected from among a number of geometric solids such as a cubic, cylindrical, prismatic, rectangular, pyramidal, truncated pyramidal, conical, hemispherical, truncated conical, cross, or post-like cross sections with a distal end. Composite pyramids may have four sides, five sides or six sides. The abrasive composites may also have a mixture of different shapes. The abrasive composites may be arranged in rows, in spirals, in helices, or in lattice fashion, or may be randomly placed.

The sides forming the abrasive composites may be perpendicular relative to the backing, tilted relative to the backing or tapered with diminishing width toward the distal end. If the sides are tapered, it is easier to remove the abrasive composite from the cavities of a mold or production tool. The tapered angle may range from about 1 to 75 degrees, preferably from about 2 to 50 degrees, more preferably from about 3 to 35 degrees and most preferably between about 5 to 15 degrees. The smaller angles are preferred because this results in a consistent nominal contact area as the composite wears. Thus, in general, the taper angle is a compromise between an angle large enough to facilitate removal of the abrasive composite from a mold or production tool and small enough to create a uniform cross sectional area. An abrasive composite with a cross section that is larger at the distal end than at the back may also be used, although fabrication may require a method other than simple molding.

The height of each abrasive composite is preferably the same, but it is possible to have composites of varying heights in a single abrasive article. The height of the composites with respect to the backing or to the land between the composites generally may be less than about 2,000 micrometers, and more particularly in the range of about 25 to 200 micrometers.

The base of the abrasive composites may abut one another or alternatively, the bases of adjacent abrasive composites may be separated from one another by some specified distance. In some embodiments, the physical contact between adjacent abrasive composites involves no more than 33% of the vertical height dimension of each contacting composite. More preferably, the amount of physical contact between the abutting composites is in the range of 1 to 25% of the vertical height of each contacting composite. This definition of abutting also covers an arrangement where adjacent composites share a common abrasive composite land or bridge-like structure which contacts and extends between facing sidewalls of the composites. Preferably, the land structure has a height of no greater than 33% of the vertical height dimension of each adjacent composite. The abrasive composite land is formed from the same slurry used to form the abrasive composites. The composites are "adjacent" in the sense that no intervening composite is located on a direct imaginary line drawn between the centers of the composites. It is preferred that at least portions of the abrasive composites be separated from one another so as to provide the recessed areas between the raised portions of the composites.

The linear spacing of the abrasive composites may range from about 1 abrasive composite per linear cm to about 100 abrasive composites per linear cm. The linear spacing may be varied such that the concentration of composites is greater in one location than in another. For example, the concentration may be greatest in the center of the abrasive article. The areal density of composites ranges from about 1 to 10,000 composites/cm$^2$.

It is also feasible to have areas of the backing exposed, i.e., where the abrasive coating does not cover the entire surface area of the backing. This type of arrangement is further described in U.S. Pat. No. 5,014,468 (Ravipati et al.).

The abrasive composites are preferably set out on a backing in a predetermined pattern or set out on a backing at a predetermined location. For example, in the abrasive article made by providing a slurry between the backing and a production tool having cavities therein, the predetermined pattern of the composites will correspond to the pattern of the cavities on the production tool. The pattern is thus reproducible from article to article.

In one embodiment of the predetermined pattern, the abrasive composites are in an array or arrangement, by which is meant that the composites are in a regular array such as aligned rows and columns, or alternating offset rows and columns. If desired, one row of abrasive composites may be directly aligned in front of a second row of abrasive composites. Preferably, one row of abrasive composites may be offset from a second row of abrasive composites.

In another embodiment, the abrasive composites may be set out in a "random" array or pattern. By this it is meant that the composites are not in a regular array of rows and columns as described above. For example, the abrasive composites may be set out in a manner as described in WO PCT 95/07797 published Mar. 23, 1995 (Hoopman et al.) and WO PCT 95/22436 published Aug. 24, 1995 (Hoopman et al.). It is understood, however, that this "random" array is a predetermined pattern in that the location of the composites on the abrasive article is predetermined and corresponds to the location of the cavities in the production tool used to make the abrasive article.

The three-dimensional, textured, abrasive article also may have a variable abrasive coating composition. For example, the center of an abrasive disc may contain an abrasive coating that is different (e.g., softer, harder, or more or less erodible) from the outer region of the abrasive disc.

Figure 4:
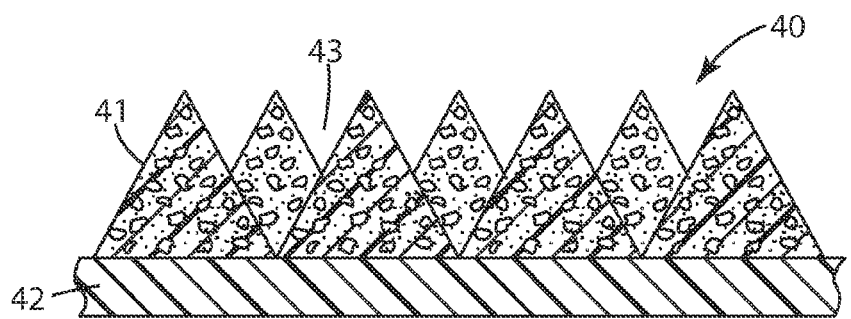
FIG. 4 is a cross sectional view of a portion of an abrasive article useful in the process of the present disclosure.

The abrasive article 40 in FIG. 4 has pyramidal abrasive composites 41 fixed or bonded to backing 42. There are recesses or valleys 43 between adjacent abrasive composites. There is also a second row of pyramidal abrasive composites offset from the first row. Outermost point or distal end of the pyramidal abrasive composites contacts the wafer surface during processing.

Figure 5:
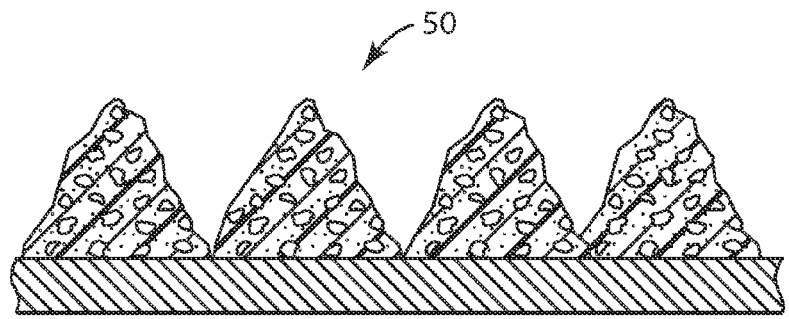
FIG. 5 is a cross sectional view of a portion of another abrasive article useful in a process of the present disclosure.

The abrasive article 50 in FIG. 5 has irregular shape, pyramidal abrasive composites. In this particular illustration, the abrasive composite has a pyramidal type shape. Boundaries which define the pyramid are irregularly shaped. The imperfect shape can be the result of the slurry flowing and distorting the initial shape prior to significant curing or solidification of the binder precursor. An irregular shape is characterized by non-straight, non-clear, non-reproducible, inexact or imperfect planes or shape boundaries.

Figure 6:
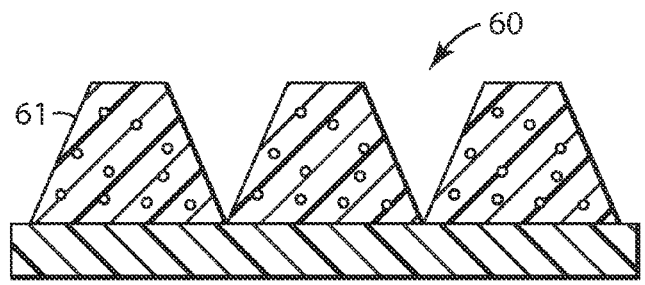
FIG. 6 is a cross sectional view of a portion of an abrasive article useful in a process of the present disclosure.

The abrasive article 60 in FIG. 6 has truncated pyramid abrasive composites 61.

Figure 7:
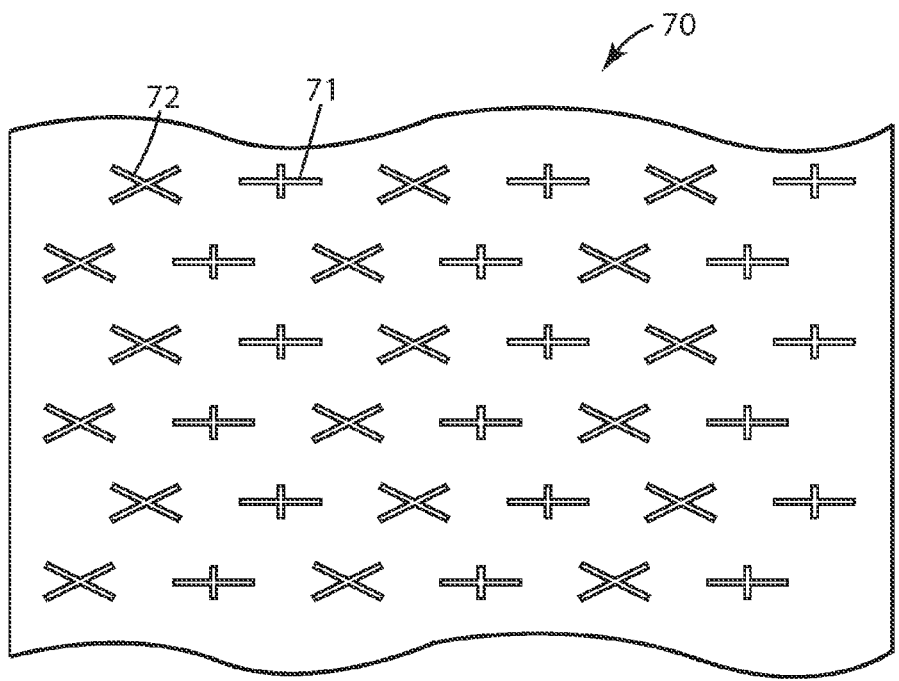
FIG. 7 is a top plan view of a portion of another abrasive article useful in a process of the present disclosure.

The abrasive article 70 in FIG. 7 has both "cross" shape 71 and an "x" shape 72 abrasive composites. The abrasive composites are set out in a pattern of rows. The abrasive composites in various rows are offset from one another and do not directly align with the abrasive composites in an adjacent row. Further, the rows of abrasive composites are separated by space or valley. The valley or space may contain only a very small amount (as measured by height) of abrasive composite or may contain no abrasive composite. Another arrangement or configuration of abrasive composites is similar to FIG. 6, except that each alternating row comprises either abrasive composites having the "cross" shape or abrasive composites having the "x" shape. In this arrangement, the abrasive composites from the odd rows are still offset from the abrasive composites from the even rows. In the above described arrangements of cross-shaped or "x"-shaped composites, it is preferred that the length of one line forming either the cross or the x shape is about 750 micrometers and the width of one line forming either the cross or the x shape is about 50 micrometers.

A preferred method for making an abrasive article having precisely shaped abrasive composites is described in U.S. Pat. Nos. 5,152,917 (Pieper et al) and 5,435,816 (Spurgeon et al.). Other descriptions of suitable methods are reported in U.S. Pat. Nos. 5,437,754 (Calhoun); 5,454,844 (Hibbard et al.); and 5,304,223 (Pieper et al.). Manufacture is preferably conducted in a clean environment (e.g., a class 100, class 1,000, or class 10,000 clean room) to minimize any contamination in the abrasive article.

A suitable method includes preparing a slurry comprising abrasive particles, binder precursor and optional additives; providing a production tool having a front surface; introducing the slurry into the cavities of a production tool having a plurality of cavities; introducing a backing to the slurry covered surface of the production tool; and at least partially curing or gelling the binder precursor before the article departs from the cavities of the production tool to form abrasive composites.

The slurry is made by combining together by any suitable mixing technique the binder precursor, the abrasive particles and the optional additives. Examples of mixing techniques include low shear and high shear mixing, with high shear mixing being preferred. Ultrasonic energy may also be utilized in combination with the mixing step to lower the slurry viscosity (the viscosity being important in the manufacture of the abrasive article) and/or affect the rheology of the resulting abrasive slurry. Alternatively, the slurry may be heated in the range of 30 to 70° C., microfluidized or ball milled in order to mix the slurry.

Typically, the abrasive particles are gradually added into the binder precursor. It is preferred that the slurry be a homogeneous mixture of binder precursor, abrasive particles and optional additives. If necessary water and/or solvent is added to lower the viscosity. The formation of air bubbles may be minimized by pulling a vacuum either during or after the mixing step.

The coating station can be any conventional coating means such as drop die coater, knife coater, curtain coater, vacuum die coater or a die coater. The preferred coating technique is a vacuum fluid bearing die reported in U.S. Pat. Nos. 3,594,865; 4,959,265 (Wood); and 5,077,870 (Millage). During coating, the formation of air bubbles is preferably minimized although in some instances it may be preferred to incorporate air into the slurry as the slurry is being coated into the production tool. Entrapped air may led to porosity such as voids in the abrasive coating and possibly increase the erodibility of the abrasive composite. Additionally, a gas can be pumped into the slurry either during mixing or coating.

After the production tool is coated, the backing and the slurry are brought into contact by any means such that the slurry wets a surface of the backing. The slurry is brought into contact with the backing by contact nip roll which forces the resulting construction together. The nip roll may be made from any material; however, the nip roll is preferably made from a structural material such as metal, metal alloys, rubber or ceramics. The hardness of the nip roll may vary from about 30 to 120 durometer, preferably about 60 to 100 durometer, and more preferably about 90 durometer.

Next, energy is transmitted into the slurry by energy source to at least partially cure the binder precursor. The selection of the energy source will depend in part upon the chemistry of the binder precursor, the type of production tool as well as other processing conditions. The energy source should not appreciably degrade the production tool or backing. Partial cure of the binder precursor means that the binder precursor is polymerized to such a state that the slurry does not flow. If needed, the binder precursor may be fully cured after it is removed from the production tool using conventional energy sources.

After at least partial cure of the binder precursor, the production tool and abrasive article are separated. If the binder precursor is not fully cured, the binder precursor can then be fully cured by either time and/or exposure to an energy source. Finally, the production tool is rewound on mandrel so that the production tool can be reused again and abrasive article is wound on a second mandrel.

In another variation of this first method, the slurry is coated onto the backing and not into the cavities of the production tool. The slurry coated backing is then brought into contact with the production tool such that the slurry flows into the cavities of the production tool. The remaining steps to make the abrasive article are the same as detailed above.

It is preferred that the binder precursor is cured by radiation energy. The radiation energy may be transmitted through the backing or through the production tool. The backing or production tool should not appreciably absorb the radiation energy. Additionally, the radiation energy source should not appreciably degrade the backing or production tool. For instance, ultraviolet light can be transmitted through a polyester backing. Alternatively, if the production tool is made from certain thermoplastic materials, such as polyethylene, polypropylene, polyester, polycarbonate, poly(ether sulfone), poly(methyl methacrylate), polyurethanes, polyvinylchloride, or combinations thereof, ultraviolet or visible light may be transmitted through the production tool and into the slurry. For thermoplastic based production tools, the operating conditions for making the abrasive article should be set such that excessive heat is not generated. If excessive heat is generated, this may distort or melt the thermoplastic tooling.

The energy source may be a source of thermal energy or of radiation energy, such as electron beam, ultraviolet light, or visible light. The amount of energy required depends on the chemical nature of the reactive groups in the binder precursor, as well as upon the thickness and density of the binder slurry. For thermal energy, an oven temperature of from about 50° C. to about 250° C. and a duration of from about 15 minutes to about 16 hours are generally sufficient. Electron beam radiation or ionizing radiation may be used at an energy level of about 0.1 to about 10 Mrad, preferably at an energy level of about 1 to about 10 Mrad. Ultraviolet radiation includes radiation having a wavelength within a range of about 200 to about 400 nanometers, preferably within a range of about 250 to 400 nanometers. Visible radiation includes radiation having a wavelength within a range of about 400 to about 800 nanometers, preferably in a range of about 400 to about 550 nanometers.

The resulting solidified slurry or abrasive composite will have the inverse pattern of the production tool. By at least partially curing or solidifying on the production tool, the abrasive composite has a precise and predetermined pattern.

The production tool has a front surface which contains a plurality of cavities or indentations. These cavities are essentially the inverse shape of the abrasive composite and are responsible for generating the shape and placement of the abrasive composites.

These cavities may have geometric shapes that are the inverse shapes of the abrasive composites. The dimensions of the cavities are selected to achieve the desired number of abrasive composites/square centimeter. The cavities may be present in a dot-like pattern where adjacent cavities butt up against one another at their portions where the indentations merge into a common substantially planar major surface of the production tool formed in the interstices of the cavities.

The production tool may be in the form of a belt, a sheet, a continuous sheet or web, a coating roll such as a rotogravure roll, a sleeve mounted on a coating roll, or die. The production tool may be made of metal, (e.g., nickel), metal alloys, or plastic. The production tool is fabricated by conventional techniques, including photolithography, knurling, engraving, hobbing, electroforming, or diamond turning. For example, a copper tool may be diamond turned and then a nickel metal tool may be electroplated off of the copper tool. Preparations of production tools are reported in U.S. Pat. Nos. 5,152,917 (Pieper et al.); 5,489,235 (Gagliardi et al.); 5,454,844 (Hibbard et al.); 5,435,816 (Spurgeon et al.); PCT WO 95/07797 (Hoopman et al.); and PCT WO 95/22436 (Hoopman et al.).

A thermoplastic tool may be replicated off a metal master tool. The master tool will have the inverse pattern desired for the production tool. The master tool is preferably made of metal, such as nickel-plated aluminum, copper or bronze. A thermoplastic sheet material optionally may be heated along with the master tool such that the thermoplastic material is embossed with the master tool pattern by pressing the two together. The thermoplastic material can also be extruded or cast onto to the master tool and then pressed. The thermoplastic material is cooled to a nonflowable state and then separated from the master tool to produce a production tool.

Suitable thermoplastic production tools are reported in U.S. Pat. No. 5,435,816 (Spurgeon et al.). Examples of thermoplastic materials useful to form the production tool include polyesters, polypropylene, polyethylene, polyamides, polyurethanes, polycarbonates, or combinations thereof. It is preferred that the thermoplastic production tool contain additives such as anti-oxidants and/or UV stabilizers. These additives may extend the useful life of the production tool. The production tool may also contain a release coating to permit easier release of the abrasive article from the production tool. Examples of such release coatings include silicones and fluorochemicals.

There are many methods for making abrasive composites having irregularly shaped abrasive composites. While being irregularly shaped, these abrasive composites may nonetheless be set out in a predetermined pattern, in that the location of the composites is predetermined. In one method, the slurry is coated into cavities of a production tool to generate the abrasive composites. The production tool may be the same production tool as described above in the case of precisely shaped composites. However, the slurry is removed from the production tool before the binder precursor is cured or solidified sufficiently for it to substantially retain its shape upon removal from the production tool. Subsequent to this, the binder precursor is cured or solidified. Since the binder precursor is not cured while in the cavities of the production tool, this typically results in the slurry flowing and distorting the abrasive composite shape.

Methods to make this type of abrasive article are reported in U.S. Pat. Nos. 4,773,920 (Chasman et al.) and 5,014,468 (Ravipati et al.).

In a variation of this method, the slurry can be coated onto the backing. The backing is then brought into contact with the production tool such that the cavities of the production tool are filled by the slurry. The remaining steps to make the abrasive article are the same as detailed above. After the abrasive article is made, it can be flexed and/or humidified prior to converting.

In another method of making irregularly shaped composites, the slurry can be coated onto the surface of a rotogravure roll. The backing comes into contact with the rotogravure roll and the slurry wets the backing. The rotogravure roll then imparts a pattern or texture into the slurry. Next, the slurry/backing combination is removed from the rotogravure roll and the resulting construction is exposed to conditions to solidify the binder precursor such that an abrasive composite is formed. A variation of this process is to coat the slurry onto the backing and bring the backing into contact with the rotogravure roll.

The rotogravure roll may impart desired patterns such as frustums of spheres, pyramids, truncated pyramids, cones, cubes, blocks, or rods. The pattern may also be hexagonal arrays, ridges, or lattices. It is also possible to have ridges made of geometric shapes such as prisms. The rotogravure roll may also impart a pattern such that there is a land area between adjacent abrasive composites. This land area can comprise a mixture of abrasive particles and binder. Alternatively, the rotogravure roll can impart a pattern such that the backing is exposed between adjacent abrasive composite shapes. Similarly, the rotogravure roll can impart a pattern such that there is a mixture of abrasive composite shapes.

Another method is to spray or coat the slurry through a screen to generate a pattern and the abrasive composites. Then the binder precursor is cured or solidified to form the abrasive composites. The screen can impart any desired pattern such as frustums of spheres, pyramids, truncated pyramids, cones, cubes, blocks, or rods. The pattern may also be hexagonal arrays, ridges, or lattices. It is also possible to have ridges made of geometric shapes such as prisms. The screen may also impart a pattern such that there is a land area between adjacent abrasive composites. This land area can comprise a mixture of abrasive particles and binder. Alternatively, the screen may impart a pattern such that the backing is exposed between adjacent abrasive composites. Similarly, the screen may impart a pattern such that there is a mixture of abrasive composite shapes. This process is reported in U.S. Pat. No. 3,605,349 (Anthon).

Another method to make a three-dimensional, textured, abrasive article uses embossed backings. Briefly, an embossed backing is coated with a slurry. The slurry follows the contours of the embossed backing to provide a textured coating. The slurry may be applied over the embossed backing by any suitable technique such as roll coating, spraying, die coating, or knife coating. After the slurry is applied over the embossed backing, the resulting construction is exposed to an appropriate energy source to initiate the curing or polymerization process to form the abrasive composite. An example of abrasive composites on an embossed backing is reported in U.S. Pat. No. 5,015,266 (Yamamoto et al.).

Another method of making an abrasive article using an embossed backing is reported in U.S. Pat. No. 5,219,462 (Bruxvoort). A slurry is coated into the recesses of an embossed backing. The slurry contains abrasive particles, binder precursor and an expanding agent. The resulting construction is exposed to conditions such that the expanding agent causes the slurry to expand above the front surface of the backing. Next the binder precursor is solidified to form abrasive composites.

A variation of this embossed backing method uses a perforated backing having an abrasive coating bonded to the front surface of the backing. This perforated backing will have a series or a predetermined placement of holes or cavities that extend through the thickness of the backing. The slurry is coated (e.g., knife coated) over the backing. These slurry-filled cavities will inherently create a textured abrasive coating. The perforated backing may optionally be removed after the curing step if the abrasive articles are supported by an appropriate carrier.

An alternative method of making the abrasive article uses thermoplastic binder. The article can be prepared with or without a backing. Typically, the thermoplastic binder, abrasive particles and any optional additives are compounded together according to conventional techniques to give a mixture, feeding the mixture into an extruder, and optionally forming the mixture into pellets or long stands. The abrasive article is then formed according to any of a variety of conventional protocols.

For example, the abrasive article may be formed by injection or compression molding the mixture using a mold having essentially the inverse pattern of the desired pattern of the abrasive article surface. The mixture may also be heated to the point at which it forms a molten slurry, which is then supplied to a mold and cooled. Alternatively, it is also possible to heat the binder until it flows and then add abrasive particles and any additives to form the molten slurry and then convert the molten slurry into abrasive composites using conventional methods.

Objects and advantages of this disclosure are further illustrated by the following examples, but the particular materials and amounts thereof recited in these examples, as well as other conditions and details, should not be construed to unduly limit this disclosure.

EXAMPLES

Test Procedure 1

The ability of a number of abrasive articles to remove metal from a wafer surface was determined by Test Procedure 1. This test procedure simulated processing a wafer surface. The wafer surface for this test procedure was a silicon oxide base wafer with either a copper or aluminum (10,000 Angstroms thick layer) surface.

The metal coated wafer was made from a single crystal silicon base unit having a diameter of 100 mm and a thickness of about 0.5 mm was purchased from either Wafernet or Silicon Valley Microelectronics, both of San Jose, Calif. Before deposition of the metal layer, a layer of thermal oxide (i.e., thermally grown silicon oxide) was grown on the silicon wafer surface. This layer was approximately 5,000 Angstroms thick. In some instances, a titanium (Ti) or a titanium nitride adhesion/barrier layer was deposited on the thermal oxide layer prior to metal deposition. The thickness of any Ti was between about 50 and 500 Angstroms, and any titanium nitride was between about 100 to 3,000 Angstroms. A uniform layer of either copper or aluminum was then deposited over the silicon base using physical vapor deposition (PVD). The thickness of the metal layer was measured using a four point probe.

The test machine was a modified Strasbaugh Lapping Machine, Model 6Y-1 similar to the apparatus depicted in FIG. 3. The wafer workpiece was rested on a foam backing available from Rodel of Newark, Del., under the trade designation "DF200", and the assembly was placed into a spring loaded plastic retaining ring. The abrasive article of the example was adhered to a "PCF20" support pad was affixed to the platen of the Strasbaugh.

The carrier head holding the wafer was brought into contact with the abrasive article and then the wafer was rotated at about 100 rpm and the abrasive article was rotated at about 67 rpm. Both the wafer and abrasive article rotated in a clockwise manner. In addition to rotating, the wafer moved through an arc (approximately 31 mm with a nine second periodicity) starting about 13 mm from the edge of the abrasive article. The abrasive article and carrier head were brought into contact with one another at a downforce of about 350 KPa (50 pounds) unless otherwise specified. Hydrogen peroxide solution (15% by weight $H_2O_2$ in deionized water) was pumped onto the wafer and abrasive interface at a flow rate of about 80 ml/minute. The abrasive article was used to polish the wafer for a one minute (60 second) cycle. After the polishing cycle, the wafer was removed from the holder, rinsed with deionized water and dried.

The metal removal rate was calculated by determining the change in metal film thickness. The initial (i.e., before polishing) and final (i.e., after polishing) measurements were taken at the same locations using the same four point probe. Between two and five readings were averaged to determine the removal rate in Angstroms per minute (Å/min.).

Before polishing the metalized wafer with the abrasive article of the examples 1-9, a wafer with a continuous layer of thermally grown silicon oxide was first polished for 1 to 4 minutes before the testing of the actual metal coated wafer. Either deionized water or hydrogen peroxide was used as the working fluid. The silicon oxide wafers were run under similar conditions to those used for the metal coated test wafers.

The designations in Table 1 are used in the description of Articles 1-14.

TABLE 1

| Material Designations | |
|---|---|
| Designation | Material |
| EAA | A 76 micrometer thick (3 mil thick) polyester film containing an ethylene acrylic acid co-polymer primer on the front surface |
| PVDC | A 100 micrometer thick (3.95 mil thick) polyester film containing an polyvinylidene chloride prime on the front surface |
| SR256 | 2 (2-ethoxyethoxy) ethyl acrylate, commercially available from Sartomer Co., Inc,. under the trade designation "SARTOMER SR256" |

TABLE 1-continued

Material Designations

| Designation | Material |
|---|---|
| SR339 | 2-phenoxy ethyl acrylate, commercially available from Sartomer Co., Inc., under the trade designation "Sartomer SR339" |
| SR351 | Trimethylolpropane triacrylate (TMPTA), commercially available from Sartomer Co., Inc., under the trade designation "Sartomer SR351" |
| SR492 | Propoxylated TMPTA, commercially available from Sartomer Co., Inc., under the trade designation "SARTOMER SR492" |
| CD501 | Propoxylated TMPTA, commercially available from Sartomer Co., Inc., under the trade designation "CD501" |
| CN980 | Aliphatic urethane acrylate, blended with 2-phenoxy ethyl acrylate, commercially available from Sartomer Co., Inc., under the trade designation "CN 980 M50" |
| LR8893 | 2,4,6-trimethylbenzoyl-diphenyl-phosphine oxide liquid photoinitiator, commercially available from BASF, Charlotte, NC under the trade designation "LUCIRIN LR8893" |
| FP4 | A dispersing agent, commercially available from ICI America Inc., Wilmington, DE under the trade designations "HYPERMER PS4" and "HYPERMER FP4" |
| D111 | A dispersing agent, commercially available from Byk Chemie, Wallingford, CT under the trade designation "DISPERBYK 111" |
| CEO | Ceria abrasive particles having an average particle size of about 0.5 micrometer, commercially available from Rhone Poulenc, Shelton, CT under the trade designation "Polishing Opaline" |
| ALT | Alumina trihydrate particles having an average particle size of about 2 micrometers, commercially available from Huber Engineered Minerals, Norcross, GA under the trade designation "MICRAL 932" |
| ALA | Agglomerated alpha alumina particles having an average particle size of about 0.3 micrometer, commercially available from Praxair Surface Technologies, Indianapolis, IN under the trade designation "A" |
| AAF | Alpha alumina particles having an average particle size of about 0.3 micrometer, commercially available from Praxair Surface Technologies, Indianapolis, IN under the trade designation "A-AF" |
| A174 | A 3-methacryloxypropyltrimethoxysilane coupling agent, commercially available from OSI Specialties, Inc., Danbury, CT, under the trade designation "A-174" |
| SR9003 | Propoxylated neopentyl glycol diacrylate from Sartomer |
| TRS2039 | Mostly alpha alumina particles having an average particle size of about 0.2 micron, obtained from Ferro Corporation, Penn Yan, NY |
| F1 | 617 Primed PET film obtained from ICI Corporation, Wilmington, DE |
| OA | Oleic acid, commercially available from Aldrich Chemical Company of Milwaukee, WI, under the designation "oleic acid, tech grade 90%" |
| B-CEA | Beta carboxyethyl acrylate, commercially available from Rhome-Poulenc of Cranbury, NJ, under the trade designation "Sipomer B-CEA |
| BTA | 1-H-benzotriazole, commercially available from Aldrich Chemical Company of Milwaukee, WI |

Article 1 was prepared by combining, in order, 18.75 grams of SR492, 56.25 grams of SR256, 1.5 grams of D111, and 2.4 grams of LR8893 and mixing with a high shear mixer for 1 minute. While still stirring, 100 grams of ALT, which had been heated at 500° C. for 4 hours, were added and the abrasive slurry was mixed for approximately 10 additional minutes. This abrasive slurry was then coated onto EAA according to the General Procedure for Making the Abrasive Article.

Article 2 was prepared by combining, in order, 56.27 grams of SR492, 168.75 grams of SR256, 15.01 grams of D111, and 7.21 grams of LR8893 and mixing with a high shear mixer for 1 minute. While still stirring, 300 grams of ALA were added and the abrasive slurry was mixed for approximately 10 additional minutes. This abrasive slurry was then coated onto EAA according to the General Procedure for Making the Abrasive Article.

Article 3 was prepared by combining, in order, 18.75 grams of SR351, 56.25 grams of SR256, 5.83 grams of FP4, and 2.49 grams of LR8893 and mixing with a high shear mixer for 1 minute. While still stirring, 400.58 grams of CEO were added and the abrasive slurry was mixed for approximately 10 additional minutes. This abrasive slurry was then coated onto EAA according to the General Procedure for Making the Abrasive Article.

Article 4 was prepared by combining, in order, 18.75 grams of SR351, 56.28 grams of SR256, 3.26 grams of D111, and 2.40 grams of LR8893 and mixing with a high shear mixer for 1 minute. While still stirring, 131.01 grams of AAF were added and the abrasive slurry was mixed for approximately 10 additional minutes. This abrasive slurry was then coated onto EAA according to the General Procedure for Making the Abrasive Article.

Article 5 was prepared by combining, in order, 18.76 grams of SR351, 56.28 grams of SR256, 8.0 grams of D111, and 2.40 grams of LR8893 and mixing with a high shear mixer for 1 minute. While still stirring, 160 grams of ALT, which had been heated at 400° C. for 4 hours, were added and the abrasive slurry was mixed for approximately 10 additional minutes. This abrasive slurry was then coated onto EAA according to the General Procedure for Making the Abrasive Article.

Articles 1-5 were tested according to Test Procedure I. For Article 1, ten different metal test wafers (designated 1-1 to 1-10) were polished with the same abrasive article, and a thermal oxide wafer was polished for 2 minutes prior to the first metal test wafer and then between each successive metal test wafer a thermal oxide wafer was polished for 4 minutes. For Article 2, a thermal oxide wafer was polished for 2 minutes prior to the metal test wafer. For Article 3, a thermal oxide wafer, a metal wafer, and a second thermal oxide wafer were polished for 1 minute prior to the metal test wafer. For Articles 4 and 5, a thermal oxide wafer was polished for 1 minute prior to the metal test wafer. For Article 4, a second thermal oxide wafer and metal test wafer were polished for 1 minute. For Article 3, the abrasive article was rotated at about 80 rpm. Table 2 below reports the type of metal layer on the wafer, the downforce between the carrier head and the abrasive article, and the metal removal rate.

TABLE 2

| Article | Metal | Downforce (KPa (lb)) | Removal Rate (Å/min.) |
|---|---|---|---|
| 1-1 | Al | 300 (43) | 11283 |
| 1-2 | Al | 300 (43) | 9000 |
| 1-3 | Al | 300 (43) | 9429 |
| 1-4 | Al | 300 (43) | 6863 |
| 1-5 | Al | 300 (43) | 8138 |
| 1-6 | Al | 300 (43) | 9903 |
| 1-7 | Al | 300 (43) | 7464 |
| 1-8 | Al | 300 (43) | 7682 |
| 1-9 | Al | 300 (43) | 7074 |
| 1-10 | Al | 300 (43) | 8642 |
| 2 | Al | 300 (43) | 6492 |
| 3 | Cu | 350 (50) | 2247 |
| 4 | Cu | 350 (50) | 2013 |
| 5 | Cu | 350 (50) | 359 |

The surface finish of the test wafers treated with Article 1 (wafer #5), Article 3 and the second metal test wafer with Article 4 was measured with a light interferometer, commercially available from WYCO Corp., Phoenix, Ariz., under the trade designation WYCO RST PLUS. The peak to valley range (Rt) measurements were 962 Å, 204 Å and 210 Å, respectively.

Article 6 was prepared by combining, in order, 7.50 grams of CN980, 45.00 grams of SR256, 3.75 grams of SR339, 18.75 grams of SR351, 7.01 grams of FP4, and 2.40 grams of LR8893 and mixing with a high shear mixer for 1 minute. While still stirring, 467.30 grams of CEO were added and the abrasive slurry was mixed for approximately 10 additional minutes. This abrasive slurry was then coated onto PVDC according to the General Procedure for Making the Abrasive Article.

Article 7 was prepared by combining, in order, 7.50 grams of CN980, 48.75 grams of SR256, 18.75 grams of SR351, 5.31 grams of D111, and 2.40 grams of LR8893 and mixing with a high shear mixer for 1 minute. While still stirring, 151.60 grams of AAF were added and the abrasive slurry was mixed for approximately 10 additional minutes. This abrasive slurry was then coated onto PVDC according to the General Procedure for Making the Abrasive Article.

Articles 6 and 7 were tested according to Test Procedure I on copper. For both Examples 6 and 7, a thermal oxide wafer was polished for 1 minute (60 seconds) prior to the metal test wafer. Multiple test wafers were tested with each example (i.e., the same abrasive article was used multiple times), with two data points calculated and averaged for each run. Table 3 below reports the metal removal rates for the various runs.

TABLE 3

| Article | Removal Rate (Å/min.) |
|---|---|
| 6 | 2872 |
| 6 | 3004 |
| 6 | 2559 |
| 6 | 2308 |
| 6 | 2307 |
| 7 | 2146 |
| 7 | 685 |
| 7 | 1306 |

Article 8 was prepared by combining, in order, 37.51 grams of CD501, 112.51 grams of SR256, 16.53 grams of D111, and 4.80 grams of LR8893 and mixing with a high shear mixer for 1 minute. While still stirring, 400.00 grams of AAF were added and the abrasive slurry was mixed for approximately 10 additional minutes. This abrasive slurry was then coated onto PVDC according to the General Procedure for Making the Abrasive Article.

Article 9 was prepared by combining, in order, 15.02 grams of CN980, 97.20 grams of SR256, 37.50 grams of SR351, 14.08 grams of FP4, and 4.80 grams of LR8893 and mixing with a high shear mixer for 1 minute. While still stirring, 938 grams of CEO were added and the abrasive slurry was mixed for approximately 10 additional minutes. This abrasive slurry was then coated onto PVDC according to the General Procedure for Making the Abrasive Article.

The abrasive articles of Articles 8 and 9 were tested according to Test Procedure I on copper, but various working fluids were used. For all runs, a thermal oxide wafer was polished for 1 minute (60 seconds) prior to the metal test wafer using DI water as the working fluid. A new abrasive article was used for each test except in the case of Article 9 with $H_2O_2$, which was tested using the same pad on which the nitric acid solution was tested. Table 4 below reports the working fluids used and the metal removal rates for the various runs.

TABLE 4

| Working Fluid | Article 8 Removal Rate (Å/min.) | Article 9 Removal Rate (Å/min.) |
|---|---|---|
| $H_2O$ | not tested | 193 |
| $H_2O_2$ | 1007 | 2471 |
| $HNO_3$ | 1598 | 175 |
| $HNO_3$ + Benzotriazole | 569 | 0 |
| $NH_4OH$ | 1940 | 1597 |
| $NH_4OH + K_3Fe(CN)_6$ | 5475 | 5713 |

The various working fluid solutions were made as follows: The $H_2O_2$ solution was made by diluting 30% hydrogen peroxide (by weight) with an equivalent weight of deionized water. The $NH_4OH$ solution was made by combining 10 ml of 30% ammonium hydroxide (by weight) with enough deionized water to make 1,000 ml total volume.

The $NH_4OH/K_3Fe(CN)_6$ solution was made by creating the previously described $NH_4OH$ solution, then combining 990 g of the $NH_4OH$ solution with 10 g of $K_3Fe(CN)_6$ and stirring until the salt was completely dissolved. The $HNO_3$ solution was made by combining 10 ml of 70% $HNO_3$ (by weight) in water with enough deionized water to make 1,000 ml total volume. The $HNO_3$/benzotriazole solution was made by creating the previously described $HNO_3$ solution, then combining 999 g of that solution with 1 gram of benzotriazole and stirring until the benzotriazole was dissolved.

Test Procedure II

The copper test pattern wafer was made by initially forming about 5,000 angstroms of silicon dioxide using a thermal deposition technique on the surface of a 4 inch silicon wafer. The wafer was patterned by etching a series of 100 micron square features to a depth of about 5,000 angstroms. The pattern wafer was then coated with 200 angstroms of PVD titanium followed by about 10,000 angstroms of PVD copper.

The test wafer was polished for a total of 7.5 minutes. A working solution composed of 15% hydrogen peroxide, 0.425% phosphoric acid, 0.2% benzotrizole, 8% polyethylene glycol (molecular weight 600) was applied to the wafer during polishing. The amounts were calculated as weight percentages. Significant areas of the wafer had copper and titanium removed from the surface of the wafer, exposing the silicon oxide stop layer except in the etched 100 micron square features.

The following examples demonstrate the utility of the fixed abrasive for planarizing a copper-deposited silicon wafer to a thermal oxide stop layer.

Article 10 was prepared by combining, in order, 60.01 grams of SR9003, 90.03 grams of SR339, 11.12 grams of D111, and 4.8 grams of LR8893 and mixing with a high shear mixer for 1 minute. While still stirring, 370.01 grams of TRS2039 was added and the abrasive slurry was mixed for approximately 10 additional minutes. This abrasive slurry was then coated onto F1 according to the General Procedure for Making the Abrasive Article using a polypropylene production tool which contained cavities in the shape of cylinders. The cylinders were about 175 microns in diameter and about 2.5 mils high with a bearing area ratio of about 20%.

Article 10 was tested according to the Test Procedure II, and the profile of the 100 micron square features on the wafer were measured to determine the extent of dishing in areas on the surface which had copper removed to expose the silicon dioxide stop layer. The Tencor P-22 profilometer was used to measure the dishing. Six different sites on the wafer were measured. The measurements are reported in Table 5.

TABLE 5

| Site | Dishing (TIR, Å) |
|---|---|
| 1 | 2957 |
| 2 | 1174 |
| 3 | 2288 |
| 4 | 3504 |
| 5 | 3271 |
| 6 | 2256 |

Test Procedure III

The copper test pattern wafer was made by initially forming about 5,000 Angstroms of silicon dioxide using a thermal deposition technique on the surface of a 4 inch silicon wafer. The wafer was patterned by etching a series of 100 micron square features to a depth of about 5,000 Angstroms. The pattern wafer was then coated with 200 Angstroms of PVD titanium followed by about 10,000 Angstroms of PVD copper.

The test wafer was polished for a total of 3.0 minutes. A working solution of 3.3% $H_2O_2$, 93.1% $H_2O$, 3.0% $(NH_4)_2HPO_4$, 0.5% $(NH_4)_3$ Citrate and 0.1% BTA was applied to the wafer during polishing. The amounts were calculated as weight percentages. Significant areas of the wafer had copper and titanium removed from the surface of the wafer, exposing the silicon oxide stop layer except in the etched 100 micron square features.

Article 11 was prepared by combining, in order, 30.0 grams SR9003, 45 grams of SR339, 6.9 grams of "DISPERBYK 111" and 2.4 grams LR8893, and mixing with a high shear mixer for 1 minute. While stirring, 370.01 grams of TRS2039 was added and the abrasive slurry was mixed for approximately 10 additional minutes. The abrasive slurry was then coated onto F1 according to the General Procedure for Making the Abrasive Article using a polypropylene production tool which contained cavities in the shape of cylinders or post. Article 11 was prepared using a production tool having 200 μm post. Article 11 was tested according to Test Procedure III and the profile of the 100 micron square features on the wafer were measured to determine the extent of dishing in areas on the surface which had copper removed to expose the silicon dioxide stop layer. The Tencor P-22 profilometer was used to measure the dishing. Four different sites on the wafer were measured. The measurements are reported in Table 6.

TABLE 6

| Site | Dishing (TIR, Å) |
|---|---|
| 1 | 1990 |
| 2 | 1880 |
| 3 | 1390 |
| 4 | 1080 |

Other abrasive articles that have been prepared are described below:

Article 12 was prepared as described for Article 11, however using a production tool having 960 μm posts.

Article 13 was prepared as described for Article 11, however, using a production tool having 1,000 μm posts. The production tools are described in greater detail below.

Article 14 was prepared by combining, in order, 30.0 grams SR90003, 45.0 grams of SR3392, 1.53 oleic acid, 3.56 B-CEA, 2.4 grams LR8893, and 144.5 grams TRS2039. The abrasive slurry was then coated onto F1 according to the General Procedure for Making the Abrasive Article using a polypropylene production tool which contained cavities in the shape of cylinders or post. Article 14 was prepared using a tool having 200 μm posts.

Article 15 was prepared as described for Article 14, however, using a production tool having 960 μm posts. Typically the method of preparing an abrasive article to be used for modifying the surface of a wafer suitable for semiconductor planarization includes a filtration step. Before coating the abrasive slurry into a production tool, the abrasive slurry is filtered through either a 60 μm or 80 μm filter.

General Procedure for Making the Abrasive Article

Abrasive articles of Articles 1-15 were made by the following procedure:

A polypropylene production tool was made by casting polypropylene material on a metal master tool having a casting surface comprised of a collection of adjacent truncated pyramids. The resulting production tool contained cavities that were in the shape of truncated pyramids. The pyramidal pattern was such that their adjacent bases were spaced apart from one another no more than about 510 micrometers (0.020 inch). The height of each truncated pyramid was about 80 micrometers, the base was about 178 micrometers per side and the top was about 51 micrometers per side.

The 200 micron post pattern is a triangular array of cylindrical posts, the posts having a diameter of 200 microns, a height of 60 microns, and a center to center spacing of 373 microns.

The 960 micron post pattern is a triangular array of cylindrical posts, the posts having a diameter of 960 microns, a height of 75 microns, and a center to center spacing of 1500 microns.

The 1,000 micron post pattern is a triangular array of square posts. The posts are 1,000 microns on a side, 100 microns high, and have a center to center spacing of 3,400 microns. The squares all have the same orientation and are oriented with one side parallel to one of the lines connecting the points in the triangular array.

There were about 50 lines/centimeter delineating the array of composites. The production tool was secured to a metal carrier plate using a masking type pressure sensitive adhesive tape. An abrasive slurry, consisting of the ingredients listed in each example, was mixed using a high shear mixer until homogenous. The abrasive slurry was then typically filtered through a 60 μm or 80 μm filter. This abrasive slurry was then coated into the cavities of the production tool using a squeegee and a primed polyester film backing was brought into contact with the abrasive slurry contained in the cavities of the production tool. The article was then passed through a bench top laboratory laminator, commercially available from Chem Instruments, Model #001998. The article was continuously fed between the two rubber rollers at a pressure between about 40-80 psi (about 275.79–551.58 kPa) and a speed setting of approximately 2 to 7. A quartz plate was placed over the article. The article was cured by passing the tool together with the backing and abrasive slurry under either two iron doped lamps, commercially available from American Ultraviolet Company or two ultraviolet ("V" bulbs), commercially available from Fusion Systems, Inc., both which operated at about 157.5 Watts/cm (400 Watts/inch). The radiation passed through the film backing. The speed was between about 10.2–

13.7 meters/minute (15-45 feet/minute) and the sample was passed through up to two times.

To prepare the abrasive article for testing, the abrasive article was laminated to a pressure sensitive adhesive tape, commercially available from Minnesota Mining and Manufacturing Company, St. Paul, Minn. Then, a 30.5 cm (12 inch) diameter circular test sample was die cut for testing.

After the planarization process is complete, the processed wafer is typically cleaned using procedures known in the art. Generally, a cleaning medium is selected such that it removes the debris without substantially damaging the wafer surface. Examples of suitable cleaning medium include tap water, distilled water, deionized water, organic solvents, and the like. They may be used alone or in combination with each other. If desired, they may also include soap or other additives to aid the cleaning process.

Typically, an abrasive article of the present disclosure is used to planarize more than one semiconductor wafer. It is within the scope of this disclosure that the abrasive article can be dressed or conditioned in between two consecutive planarization steps. The conditioning step can remove "worn abrasive particles" and/or to remove any undesirable deposits or debris, and thereby enhance the cutting ability of the abrasive article, as well as the quality of the planarized surface. In such circumstances, the surface of the abrasive article may be conditioned according to well-known, conventional techniques, including contacting the abrasive surface with a diamond conditioning tool, brush, bonded abrasive, coated abrasive, metal rod, water jet, or the like. Other techniques include exposure to a laser or to corona energy (e.g., using a Sherman corona treating unit available from Sherman Treaters, Ltd., United Kingdom). This conditioning step is not always preferred due to the time and money associated with the conditioning step. It is within the scope of this disclosure that the abrasive is not dressed or conditioned in between two consecutive planarization steps.

Evaluation of Working Liquids

A series of experiments was carried out to evaluate various working liquids useful in modifying a surface of a wafer suited for fabrication of a semiconductor device. In one exemplary embodiment, the working liquids were aqueous solutions of initial components substantially free of loose abrasive particles, the components comprising water, a surfactant, and a pH buffer exhibiting at least one $pK_a$ greater than 7, the pH buffer comprising a basic pH adjusting agent and an acidic complexing agent, and the working liquid exhibiting a pH from about 7 to about 12. The surfactant-containing working liquids were evaluated for their ability to accelerate or maintain the oxide removal rate in a stop-on-nitride CMP process using a fixed abrasive web.

A Reflexion™ web polisher (Applied Materials, Inc., Santa Clara, Calif.) was used to polish 200 mm Blanket TEOS wafers on a 200 mm Profiler II wafer carrier using a 3M SWR550-125/10 fixed abrasive web (3M Company, St. Paul, Minn.) mounted on a 60/90 ribbed subpad (3M Company, St. Paul, Minn.). Surfactant-containing working liquids were prepared in deionized water with 0.1% w/w of a selected surfactant in a buffered aqueous solution of ammonium hydroxide (as a basic pH control agent) and 2.5% w/w L-proline (as an acidic multidentate complexing agent). For comparison purposes, a control working liquid was also prepared comprising only a buffered aqueous solution of ammonium hydroxide (as a basic pH control agent) and 2.5% w/w L-proline (as an acidic multidentate complexing agent). The working liquids were individually applied to the wafer surface during the CMP process at a volumetric flowrate of 100 mL/min.

The evaluated surfactants are listed in Table 7. The surfactants were combined with water, a basic pH adjusting agent (e.g. ammonium hydroxide) and a multidentate amino acid complexing agent (e.g. 2.5% w/w/L-proline) over a pH range from about 9 to 12. The working liquids were then applied in combination with 3M's microreplicated fixed abrasive products to carry out a CMP process useful in use in semiconductor device manufacturing.

TABLE 7

| | | Surfactant Designations | | |
|---|---|---|---|---|
| Surfactant Name | Surfactant Type | Source | Hydrophile-Lipophile Balance (HLB) | Critical Micelle Concentration (ppm) |
| Envirogem AD01 | Alkane di-alcohol | Air Products & Chemicals, Inc., Allentown, PA | 4 | — |
| Surfynol 61 | Acetylenic primary alcohol | Air Products & Chemicals, Inc., Allentown, PA | — | — |
| Surfynol 420 | Acetylenic di-alcohol ethoxylate | Air Products & Chemicals, Inc., Allentown, PA | 4 | — |
| Dynol 604 | Acetylenic di-alcohol ethoxylate | Air Products & Chemicals, Inc., Allentown, PA | — | — |
| Dynol 607 | Acetylenic di-alcohol ethoxylate | Air Products & Chemicals, Inc., Allentown, PA | 8 | — |
| Triton X-45 | Secondary alcohol ethoxylate | Dow Chemical Co., Midland, MI | 9.8 | — |
| Tergitol 15-S-7 | Secondary alcohol ethoxylate | Dow Chemical Co., Midland, MI | 12.4 | — |
| Tergitol Minfoam 1X | Secondary alcohol ethoxylate | Dow Chemical Co., Midland, MI | 12.6 | 33 |

TABLE 7-continued

| | | | Hydrophile- | Critical |
| | | | Lipophile | Micelle |
| Surfactant | Surfactant | | Balance | Concentration |
| Name | Type | Source | (HLB) | (ppm) |
|---|---|---|---|---|
| Tergitol TMN-100X | Secondary alcohol ethoxylate | Dow Chemical Co., Midland, MI | 14.1 | 830 |
| Tergitol XH | Secondary alcohol ethoxylate | Dow Chemical Co., Midland, MI | 14-15 | 0.7 |
| NCW-1001 | Secondary alcohol ethoxylate | Wako Chemical Co., Richmond, VA | — | 100 |
| NCW-1002 | Secondary alcohol ethoxylate | Wako Chemical Co., Richmond, VA | — | 600 |
| L-19909 | Fluorochemical surfactant, a solution of 85-95% w/w fluoroaliphatic polymeric esters and 5-10% w/w polyether polymer in <2% 1-methyl-2-pyrrolidinone/toluene/2-propenoic acid blend | 3M Co., St. Paul, MN | 12 | 350 |

Specific advantages that may result at alkaline pH include the use of lower polishing pressures while maintaining adequate oxide removal rates. Generally lower polishing pressures result in reduced defects and improved yields. The polishing process parameters included a 5 mm increment, a 3 psi (about 20.68 kPa) wafer pressure, a plate rotational speed of 30 revolutions per minute (RPM), a carrier rotational speed on 28 RPM, and a polishing time of 60 seconds per wafer. The results of the CMP evaluations of the surfactant-containing working liquids and the control working liquids are shown in Table 8.

TABLE 8

| Surfactant Name | Surfactant Concentration (% w/w) | pH | Oxide Removal Rate (Å/min.) | Nitride Removal Rate (Å/min.) |
|---|---|---|---|---|
| Control | 0.0 | 10.5 | 322 | — |
| Envirogem AD01 | 0.05 | 10.5 | 686 | — |
| Surfynol 61 | 0.05 | 10.5 | 842 | 0 |
| Surfynol 420 | 0.05 | 10.5 | 636 | — |
| Dynol 604 | 0.05 | 10.5 | 777 | 1 |
| Dynol 607 | 0.05 | 10.5 | 875 | 1 |
| Triton X-45 | 0.05 | 10.5 | 866 | 1 |
| Tergitol 15-S-7 | 0.05 | 10.5 | 1,336 | 5 |
| Tergitol Minfoam 1X | 0.05 | 10.5 | 773 | — |
| Tergitol TMN-100X | 0.05 | 10.5 | 679 | — |
| Tergitol XH | 0.05 | 10.5 | 681 | — |
| NCW-1001 | 0.05 | 10.5 | 1,065 | 0 |
| NCW-1002 | 0.05 | 10.5 | 917 | 0 |
| Control | 0.05 | 7.0 | 68 | — |
| Dynol 607 | 0.05 | 7.0 | 260 | — |
| Tergitol 15-S-7 | 0.05 | 7.0 | 236 | — |
| Tergitol X-45 | 0.05 | 7.0 | 189 | — |
| NCW-1001 | 0.05 | 7.0 | 176 | — |

As shown in Table 8, use of surfactants in conjunction with 2.5% w/w L-proline at a pH from 7 to 12 yielded greater than a two times increase in oxide removal rate relative to the control working liquid without surfactant at similar pH. In certain examples where the pH is between about 9 and 11, the oxide removal rate exceeds the nitride removal rate by a factor of 200 or more, thereby permitting stop on nitride selectivity when the working fluid is used in a CMP STI method.

Another series of experiments was carried out to evaluate the use of surfactant to accelerate the break-in period for a fixed abrasive web used in CMP. A Reflexion™ web polisher (Applied Materials, Santa Clara, Calif.) was used to polish a 200 mm Blanket TEOS wafer on a 200 mm Profiler II wafer carrier (3M Company, St. Paul, Minn.) using a 3M SWR550-125/10 fixed abrasive web (3M Company, St. Paul, Minn.) mounted on a 60/90 ribbed subpad. A working liquid comprising 2.5% w/w L-Proline in deionized water with 0.05% w/w Tergitol™ 15-S-7 surfactant (Dow Chemical Company, Midland, Mich.) was used at a volumetric flowrate of 100 mL/min. The polishing process parameters included a 5 mm increment, a 3 psi (about 20.68 kPa) wafer pressure, a plate rotational speed of 30 revolutions per minute (RPM), a carrier rotational speed on 28 RPM, and a polishing time of 60 seconds per wafer.

Figure 8:
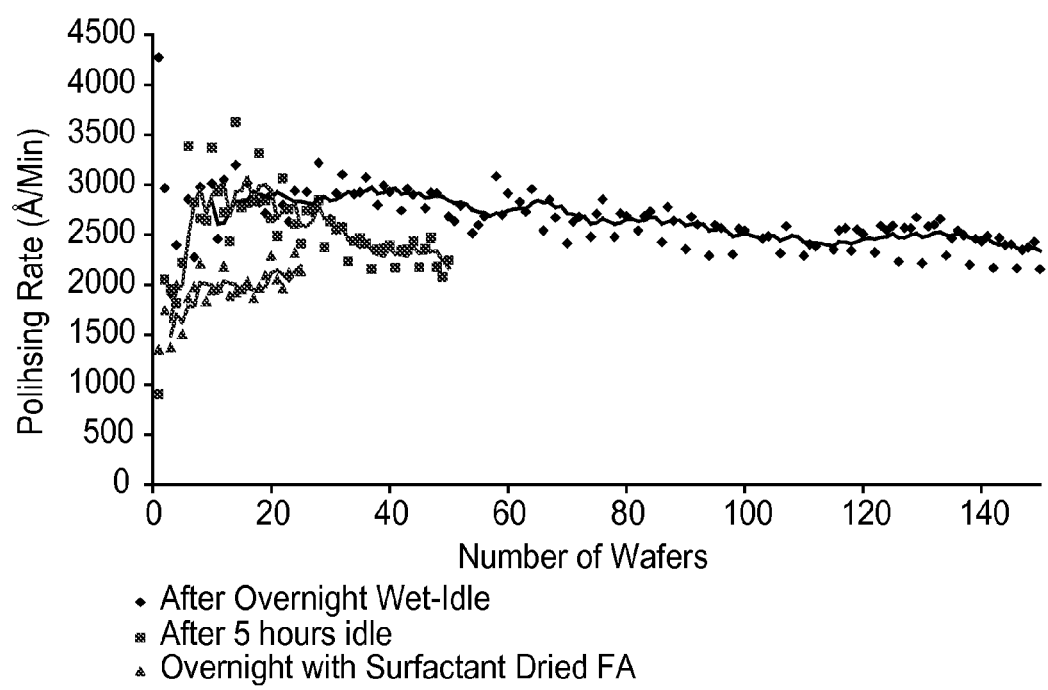
FIG. 8 is a plot of polishing rate as a function of the number of wafers processed according to an embodiment of the present disclosure.

Three different fixed abrasive break-in procedures were used. The number of wafers needed to reach a stable oxide removal rate at a target value of 2000-2500 Å/min. was determined. FIG. 8 shows the polishing rate as a function of the number of wafers processed for each break-in procedure evaluated in this experiment.

In the first test (illustrated by the diamond symbol in FIG. 8), 145 wafers were processed in order to obtain a constant (stable within +/−200 Å/min.) polishing rate at the target of 2000-2500 Å/min had reached an equilibrium state. Prior to this test, a standard wet idle had been run overnight (about 15 hours of idle time) with the fixed abrasive web in only deionized water. The polishing rate did not completely stabilize at the target 2000-2500 Å/min. rate until all 140 wafers had been run. This represents an excessively long break-in period to achieve a stable polishing rate. The second test (illustrated by the square symbol in FIG. 8) was run after a 5 hour wet idle. In the second test, about 40 wafers were required to be processed in order to bring the polishing rate to a stable target polishing rate of 2000-2500 Å/min. This is still an undesirably long break-in period. The third test (illustrated by the triangle symbol in FIG. 8) was run after the fixed abrasive web was soaked with the surfactant-containing working liquid and allowed to dry on the web overnight at room temperature. No rinsing of the fixed abrasive web was performed during the idle time prior to the polishing. Here, the polishing rate reached a stable value at the target 2000-2500 Å/min rate after processing only about 25 wafers.

Other methods for keeping the surfactant on the fixed abrasive could be used as well. One example would be, rather than pumping straight deionized water onto the web during wet idle, to use the surfactant-containing working liquid. Another example could be the use of the surfactant alone, or the surfactant diluted into deionized water and pumped onto the fixed abrasive web polishing surface during idle times. Another method could use a concentrated solution of the surfactant applied to the fixed abrasive surface just after an idle period.

It is apparent to those skilled in the art from the above description that various modifications can be made without departing from the scope and principles of this disclosure, and it should be understood that this disclosure is not to be unduly limited to the illustrative embodiments set forth hereinabove. Various embodiments of the disclosure have been described. These and other embodiments are within the scope of the following claims.

The invention claimed is:

1. A working liquid useful in modifying a surface of a wafer suited for fabrication of a semiconductor device, the liquid being an aqueous solution of initial components substantially free of loose abrasive particles, the components comprising:
   a. an aqueous solvent, wherein the aqueous solvent comprises water;
   b. a pH buffer exhibiting at least one $pK_a$ greater than 7, wherein the pH buffer comprises a basic pH adjusting agent and a multidentate acidic complexing agent, wherein the multidentate acidic complexing agent comprises at least one of an amino acid or a dipeptide formed from an amino acid; and
   c. a nonionic surfactant exhibiting a hydrophile-lipophile balance of at least about 4;
   d. wherein the working liquid exhibits a pH from about 7 to about 12.

2. A working liquid of claim 1, wherein the basic pH adjusting agent is selected from the group consisting of alkali metal hydroxides, alkaline earth metal hydroxides, ammonium hydroxide, and mixtures thereof.

3. The working liquid of claim 1, wherein the amino acid is selected from alanine, proline, glycine, histidine, lysine, arginine, ornithene, cysteine, tyrosine, and combinations thereof 4. The working liquid of claim 3, wherein the amino acid is L-proline.

5. The working liquid of claim 1, wherein the nonionic surfactant is selected from a linear primary alcohol ethoxylate, a secondary alcohol ethoxylate, a branched secondary alcohol ethoxylate, an octylphenol ethoxylate, an acetylenic primary alcohol ethoxylate, an acetylenic primary di-alcohol ethoxylate, an alkane di-alcohol, a hydroxyl-terminated ethylene oxide-propylene oxide random copolymer, a fluoroaliphatic polymeric ester, and mixtures thereof 6. The working liquid of claim 1, wherein the nonionic surfactant is present in an amount of at least about 0.025% and at most about 0.2% by weight of the working liquid.

7. The working liquid of claim 1, wherein the acidic complexing agent is present in an amount from about 0.1% by weight to about 5% by weight of the working liquid.

8. The working liquid of claim 1, wherein the basic pH adjusting agent is present in an amount sufficient to produce a pH from about 10 to about 11, the acidic complexing agent comprises L-proline in an amount from about 2% to about 4% by weight of the working liquid, and the surfactant comprises an ethoxylated alcohol in an amount from about 0.05% to about 0.5% by weight of the working liquid.

9. The working liquid of claim 1, wherein the working liquid exhibits a pH from about 9 to about 11.

* * * * *